US011181676B2

(12) United States Patent
Ueno et al.

(10) Patent No.: US 11,181,676 B2
(45) Date of Patent: Nov. 23, 2021

(54) POLARIZING FILM AND IMAGE DISPLAY DEVICE

(71) Applicant: NITTO DENKO CORPORATION, Ibaraki (JP)

(72) Inventors: Tomonori Ueno, Ibaraki (JP); Shinya Hiraoka, Ibaraki (JP); Hiromi Ikeshima, Ibaraki (JP); Atsushi Kishi, Ibaraki (JP)

(73) Assignee: NITTO DENKO CORPORATION, Osaka (JP)

( * ) Notice: Subject to any disclaimer, the term of this patent is extended or adjusted under 35 U.S.C. 154(b) by 508 days.

(21) Appl. No.: 16/088,736

(22) PCT Filed: Mar. 17, 2017

(86) PCT No.: PCT/JP2017/010975
§ 371 (c)(1),
(2) Date: Sep. 26, 2018

(87) PCT Pub. No.: WO2017/169918
PCT Pub. Date: Oct. 5, 2017

(65) Prior Publication Data
US 2020/0301057 A1    Sep. 24, 2020

(30) Foreign Application Priority Data

Mar. 29, 2016    (JP) .............................. JP2016-066369

(51) Int. Cl.
*G02B 5/30*    (2006.01)
*G02F 1/1335*    (2006.01)
(Continued)

(52) U.S. Cl.
CPC ..... *G02B 5/3033* (2013.01); *G02F 1/133528* (2013.01); *G06F 1/1607* (2013.01); *H01L 51/5281* (2013.01); *G02B 1/11* (2013.01)

(58) Field of Classification Search
CPC ...... G02B 5/3033; G02B 5/30; G02B 5/3025; G02B 5/3041; G02B 5/305; G02B 1/11;
(Continued)

(56) References Cited

U.S. PATENT DOCUMENTS

2009/0091826 A1 *    4/2009 Sugino ................... G02B 5/305
                                                                 359/489.2
2012/0055607 A1    3/2012 Kitagawa et al.
(Continued)

FOREIGN PATENT DOCUMENTS

CN    103151467 A    6/2013
CN    104246554 A    12/2014
(Continued)

OTHER PUBLICATIONS

Office Action dated Dec. 15, 2019, issued in counterpart KR Application No. 10-2018-7023214, with English translation (11 pages).
(Continued)

*Primary Examiner* — Stephone B Allen
*Assistant Examiner* — Adam W Booher
(74) *Attorney, Agent, or Firm* — Westerman, Hattori, Daniels and Adrian, LLP (57) ABSTRACT

A polarizing film provided on the viewing side in an image display device of the present invention, wherein the polarizing film has a polarizer and a first transparent resin layer on the viewing side of the polarizer. The polarizer contains a polyvinyl alcohol-based resin, has a thickness of 10 μm or less, and has, on the side of the first transparent resin layer, a compatible layer which is compatible with the first transparent resin layer and which corresponds to a thickness of 2 to 10% of the thickness of the polarizer. This polarizing film
(Continued)

can make it possible to inhibit color phase changes when displaying black, even when a thin-type polarizer is being used.

13 Claims, 2 Drawing Sheets (51) Int. Cl.
*G06F 1/16* (2006.01)
*H01L 51/52* (2006.01)
*G02B 1/11* (2015.01)

(58) Field of Classification Search
CPC . G02B 27/28; G02F 1/133528; G06F 1/1607; H01L 51/5281
See application file for complete search history.

(56) References Cited

U.S. PATENT DOCUMENTS

| | | |
|---|---|---|
| 2012/0055608 A1 | 3/2012 | Kitagawa et al. |
| 2012/0055621 A1 | 3/2012 | Goto et al. |
| 2012/0055622 A1 | 3/2012 | Kitagawa et al. |
| 2012/0055623 A1 | 3/2012 | Kitagawa et al. |
| 2012/0056211 A1 | 3/2012 | Kitagawa et al. |
| 2012/0056340 A1 | 3/2012 | Kitagawa et al. |
| 2012/0057104 A1 | 3/2012 | Kitagawa et al. |
| 2012/0057231 A1 | 3/2012 | Goto et al. |
| 2012/0058291 A1 | 3/2012 | Kitagawa et al. |
| 2012/0058321 A1 | 3/2012 | Goto et al. |
| 2013/0147727 A1 | 6/2013 | Lee et al. |
| 2014/0111858 A1* | 4/2014 | Toyama ............... C08J 5/18 359/483.01 |
| 2015/0022748 A1 | 1/2015 | Takeda et al. |
| 2015/0253479 A1 | 9/2015 | Nojiri et al. |
| 2015/0355386 A1 | 12/2015 | Horii et al. |
| 2016/0062175 A1 | 3/2016 | Jeon et al. |
| 2016/0130478 A1 | 5/2016 | Nagata et al. |

FOREIGN PATENT DOCUMENTS

| | | |
|---|---|---|
| CN | 104903763 A | 9/2015 |
| CN | 105388657 A | 3/2016 |
| JP | 2003-179004 A | 6/2003 |
| JP | 4751481 B1 | 8/2011 |
| JP | 2013-113896 A | 6/2013 |
| JP | 2014-78016 A | 5/2014 |
| JP | 2015-71740 A | 4/2015 |
| JP | 2015-180921 A | 10/2015 |
| JP | 2016-24228 A | 2/2016 |
| WO | 2015/068483 A1 | 5/2015 |

OTHER PUBLICATIONS

Search Report dated May 19, 2020, issued in counterpart CN Application No. 201780017632.0. (3 pages).
Office Action dated Jul. 1, 2020, issued in counterpart TW application No. 106109675, with English translation. (11 pages).
International Search Report dated Apr. 25, 2017, issued in counterpart International Application No. PCT/JP2017/010975 (2 pages).
Notification of Reasons for Refusal dated Sep. 7, 2018, issued in counterpart Japanese Patent Application No. 2016-066369, w/English translation (7 pages).
Notification of Transmittal of Translation of the International Preliminary Report on Patentability (Form PCT/IB/338) issued in counterpart International Application No. PCT/JP2017/010975 dated Oct. 11, 2018, with Forms PCT/IB/373 and PCT/ISA/237. (8 pages).

* cited by examiner

POLARIZING FILM AND IMAGE DISPLAY DEVICE

TECHNICAL FIELD

The present invention relates to a polarizing film provided on the viewing side in an image display device. The present invention also relates to an image display device in which the polarizing film is disposed on the viewing side. Examples of the image display device include a liquid crystal display device, an organic EL (electroluminescence) display device, a PDP (plasma display panel), an electronic paper, and the like.

BACKGROUND ART

The image forming system of liquid crystal display devices has polarizing films placed as essential components on both sides of glass substrates that form the liquid crystal panel surfaces. A polarizing film generally used includes a polarizer and a transparent protective film or films bonded to one or both surfaces of the polarizer with a polyvinyl alcohol-based adhesive or any other adhesive, in which the polarizer includes a polyvinyl alcohol-based film and a dichroic material such as iodine.

In addition, thinning of an image display device has been demanded, and reduction in thickness has also been carried out for polarizers. For example, a thin polarizer exhibiting high alignment with controlled optical properties of single-body transmittance and polarization degree has been proposed (Patent Document 1).

PRIOR ART DOCUMENTS

Patent Documents

Patent Document 1: JP-B1-4751481

SUMMARY OF THE INVENTION

Problems to be Solved by the Invention

However, unlike a polarizer having a normal thickness, it was found that a thin polarizer has a high reflectance, and in particular, reflectance on the long wavelength side is high. When a thin polarizer is provided on the viewing side of an image display device and a low reflection treatment layer is applied to the viewing side (for example, the outermost surface of the polarizing film on the viewing side) from the thin polarizer, it was found that a hue change in which black display turns reddish caused by reflected light from the thin polarizer.

The present invention relates to a polarizing film provided on the viewing side in an image display device, and an object of the present invention is to provide a polarizing film capable of suppressing hue change when displaying black even in the case where the polarizing film uses a thin polarizer. It is another object of the present invention to provide an image display device having the polarizing film.

Means for Solving the Problems

As a result of intensive studies, the inventors have accomplished the invention based on findings that the problems can be solved by the polarizing film and other means described below.

That is, the present invention relates to a polarizing film provided on the viewing side in an image display device, wherein the polarizing film has a polarizer and a first transparent resin layer on the viewing side of the polarizer, and the polarizer contains a polyvinyl alcohol-based resin, has a thickness of 10 μm or less, and has, on the side of the first transparent resin layer, a compatible layer which is compatible with the first transparent resin layer and which corresponds to a thickness of 2 to 10% of the thickness of the polarizer.

In the polarizing film, the first transparent resin layer can use a formed product of a forming material containing a polyvinyl alcohol-based resin or a forming material containing an aqueous emulsion.

In the polarizing film, the thickness of the first transparent resin layer is preferably 0.2 μm or more and 3 μm or less.

In the polarizing film, the polarizer is preferably designed so that optical properties represented by a single-body transmittance T and a polarization degree P satisfy the condition of the following formula:

$$P > -(10^{0.929T-42.4}-1) \times 100 \text{ (provided that } T<42.3\text{) or}$$
$$P \geq 99.9 \text{ (provided that } T \geq 42.3\text{)}.$$

The polarizing film having a second transparent resin layer on the side opposite to the viewing side of the polarizer can be used.

The polarizing film can be suitably applied when a low reflection treatment layer is further provided on the viewing side of the first transparent resin layer. The low reflection treatment layer is effective when the reflectance is 2% or less.

Further, the present invention relates to an image display device having at least a polarizing film, wherein a polarizing film provided on the viewing side in the image display device is the polarizing film above mentioned, and the first transparent resin layer of the polarizing film is disposed so as to be on the viewing side.

The present invention also relates to an image display device having the polarizing film and a low reflection treatment layer disposed on the viewing side of the polarizing film. The low reflection treatment layer is effective when the reflectance is 2% or less.

Effect of the Invention

The polarizing film of the present invention employs a thin polarizer having a thickness of 10 μm or less. On the viewing side of the thin polarizer, a first transparent resin layer that forms a compatible layer with the thin polarizer is provided. The compatible layer is formed in the vicinity of the surface of the polarizer since a part of the material that forms the first transparent resin layer penetrates into the polarizer and the component near the surface of the polarizer seeps out. Such a compatible layer can be formed by forming a transparent resin layer on the surface of the polarizer using a material that permeates into the polarizer.

Preparation of a general polarizer is carried out, for example, by subjecting a polyvinyl alcohol-based resin (film) to a stretching step, so that the resin molecules in the obtained polarizer are aligned in a certain degree of regularity. In contrast, the first transparent resin layer formed on the surface of the polarizer is formed, for example, by coating. Therefore, the first transparent resin layer is not subjected to a stretching step, and the molecules forming the first transparent resin layer are not regularly aligned. As described above, the compatible layer of the present invention is formed by penetrating the forming component of the first transparent resin layer into the polarizer. When the first transparent resin layer is formed, the component of the first transparent resin layer penetrating into the polarizer has a function of partially alleviating the alignment of molecules in the polarizer. It should be noted that the present invention is not limited by this putative mechanism.

The compatible layer breaks the alignment of the polyvinyl alcohol-based resin, so that the refractive index in the absorption axis direction is inclined and the density distribution of iodine or the like in the vicinity of the polarizer is inclined. According to the polarizing film of the present invention, even when a thin polarizer is used, it is possible to control so that the reflectance of the thin polarizer is not increased by the compatible layer. As a result, when displaying black, the contribution ratio of the reflected light at the thin polarizer, which has a high reflectance on the longer wavelength side with respect to the whole outgoing light from the polarizing film, can be suppressed, so that it can be considered that the hue change in which the black display turns reddish could be suppressed.

MODE FOR CARRYING OUT THE INVENTION

Figure 1A:
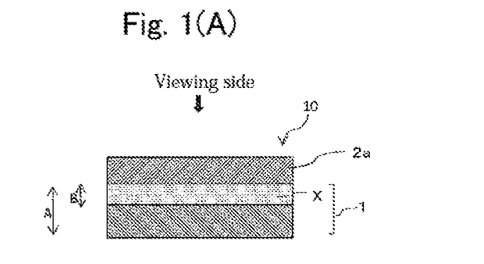
FIGS. 1(A) and 1(B) are an example of a schematic cross-sectional view of a polarizing film of the present invention.
Figure 1B:
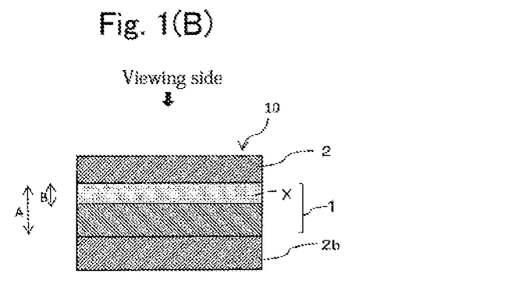

Hereinafter, polarizing films 10 and 11 of the present invention will be described with reference to FIGS. 1(A)-2(C). The polarizing films 10 and 11 have a polarizer 1 and a transparent resin layer 2 (2a, 2b). As shown in FIGS. 1(A)-2(C), on the side of the first transparent resin layer 2a of the polarizer 1, a compatible layer X with the transparent resin layer 2a is provided. In FIG. 1(A) only the polarizer 1, the compatible layer X, and the transparent resin layer 2a are shown. Although not shown, a resin substrate may be provided on the side of the polarizer 1 in FIG. 1(A). As the resin substrate, for example, a resin substrate used for producing the thin type polarizer 1 can be mentioned. On the other hand, as shown in FIG. 1(B), on the polarizer side (the side opposite to the first transparent resin layer 2a) in FIG. 1(A), the polarizing film 10 of the present invention has a second transparent resin layer 2b. The second transparent resin layer 2b is also preferable from the viewpoint of improving crack resistance. Although not shown in FIG. 1(B), a compatible layer X similar to that in FIG. 1(A) can be provided on the second transparent resin layer 2b side of the polarizer 1.

Figure 2A:
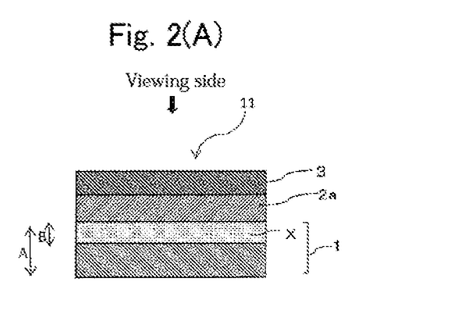
FIGS. 2(A)-2(C) are an example of a schematic cross-sectional view of a polarizing film of the present invention.
Figure 2B:
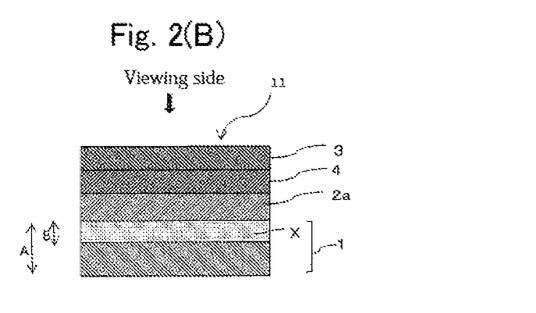
Figure 2C:
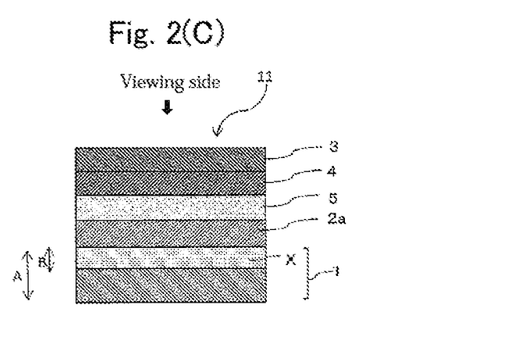

In addition, in the polarizing film II of FIGS. 2(A)-2(C) a low reflection treatment layer 3 is further provided on the viewing side, of the first transparent resin layer 1a of the polarizing film 10 in FIG. 1(A), In FIG. 2(A), the low reflection treatment layer 3 is provided directly on the first transparent resin layer 2a. In FIG. 2(B), the low reflection treatment layer 3 is provided via a substrate film 4, In FIG. 2(C), the substrate film 4 included in the low reflection treatment layer 3 is provided via a pressure-sensitive adhesive layer 5. It should be noted that in FIGS. 2(A) 2(C), only the polarizing film 10 of FIG. 1(A) is described, but the polarizing film described in FIG. 1(B) can be similarly applied.

Although not shown in FIG. 2(B), the transparent resin layer 2a and the substrate film 4 can be laminated via an intervening layer such as an adhesive layer, a pressure-sensitive adhesive layer, an undercoat layer (primer layer) and the like. Although not shown, it is possible to laminate an easy adhesion layer and an adhesive layer by providing the easy adhesion layer or performing an activating treatment on the substrate film 4.

Although not shown, a pressure-sensitive adhesive layer can be provided on the side opposite to the viewing side of the polarizing films 10 and 11 of the present invention. Further, a separator can be provided on the pressure-sensitive adhesive layer. In addition, a surface protective film can be provided for the polarizing films 10 and 11 of the present invention (especially when having the low reflection treatment layer 3).

In the polarizing films 10 and 11 of the present invention, the compatible layer X is a layer formed by impregnating the components of forming the first transparent resin layer 2a inside from the surface of the polarizer 1. From this viewpoint, in the present invention, the ratio ((B/A)×100%) of the thickness B of the compatible layer to the thickness A (100%) of the polarizer 1 is adjusted to be 2 to 10%. The thickness B of the compatible layer X is adjusted in relation to the thickness A of the polarizer 1. The ratio of the thickness B of the compatible layer is preferably 4 to 10%, more preferably 6 to 10%, from the viewpoint of suppressing hue change when displaying black. When the ratio of the thickness B of the compatible layer exceeds 10%, the ratio of the compatible layer X at the thickness A of the polarizer 1 becomes too large, which may impair the optical properties. On the other hand, when the ratio of the thickness B of the compatible layer is less than 2%, it is not possible to sufficiently suppress the hue change on the long wavelength side when displaying black.

The thickness B of the compatible layer X can be measured by the method described in Examples.

The polarizing films 10 and 11 of the present invention are each applied as a polarizing film provided on the outermost viewing side in an image display device. The side opposite to the viewing side of the polarizing films 10 and 11 is applied as the display side. The display portion forms a part of the image display device together with at least one polarizing film. Specifically, the image display device includes a liquid crystal display device, an organic EL (electroluminescence) display device, a PDP (plasma display panel), an electronic paper, etc.

Further, the polarizing film 10 of the present invention can be applied to an image display device in a configuration where a low reflection treatment layer 3 is disposed on the viewing side of the polarizing film 10. For example, the low reflection treatment layer 3 can be applied to the surface of an input device such as a touch panel applied on the viewing side of the image display device, or to the surface of a transparent substrate such as a cover glass, a plastic cover, etc. The configuration of the image display device is suitable for application in such a manner that no air layer (air gap) is interposed between the transparent substrate having the low reflection treatment layer 3 and the polarizing film 10. When no air layer is interposed between the transparent substrate having the low reflection treatment layer 3 and the polarizing film 10, since at the time of displaying black, the contribution ratio of the reflected light in the thin polarizer having a high reflectance on the longer wavelength side to the whole outgoing light from the image display device becomes higher, the hue change in which the black display turns reddish becomes easily apparent. The transparent substrate may be a glass plate or a transparent acrylic plate (PMHA plate). The transparent substrate is a so-called cover glass and can be used as a decorative panel.

Figure 3:
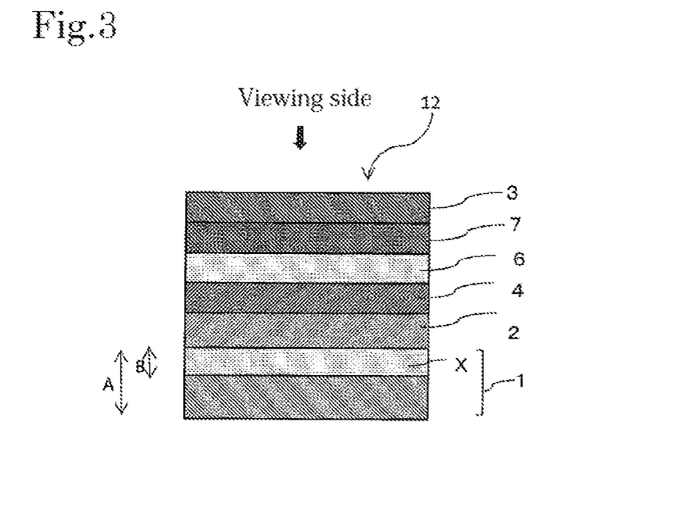
FIG. 3 is an example of a schematic cross-sectional view of an image display device of the present invention.

FIG. 3 is one example of the above embodiments, wherein on the viewing side of the polarizing film 10, the substrate film 4 (including those having a surface treatment layer such as a hard coat layer) is provided and is bonded to the transparent substrate 7 via the interlayer filler 6. The transparent substrate 7 is provided with the low reflection treatment layer 3. As the interlayer filler, the same materials as those of the following pressure-sensitive adhesive layer can be used. The layer that is formed by the interlayer filler is preferably an active energy ray-curable pressure-sensitive adhesive layer.

In addition, in the image display device, an optical film used for forming an image display device such as a liquid crystal display device, an organic EL display device, or the like is appropriately used. Examples of the optical film include optical layers that are sometimes used for forming liquid crystal display devices and the like, such as a reflection plate, an anti-transmission plate, a retardation plate (including a half-wave plate and a quarter-wave plate), an optical compensation film, a viewing angle compensation film, and a brightness enhancement film. In addition to being usable as an optical film singly, these can be used in one or two or more layers by stacking them in practical use for the one-side-protected polarizing film.

In general, a liquid crystal display device is formed by properly assembling components such as a liquid crystal cell (glass substrate/liquid crystal layer/glass substrate configuration) and polarizing films disposed on both sides thereof and optionally a lighting system and the like, and by incorporating a driving circuit thereinto. Any type of liquid crystal cells such as TN type, STN type, π type, VA type, IPS type or the like can be used. Further, it is possible to form an appropriate liquid crystal display device wherein a backlight or a reflection plate is used for the illumination system. The process of forming the liquid crystal display device may also include placing, at an appropriate position or positions, one or more layers of an appropriate component such as a diffusion plate, an antiglare layer, an anti-reflection film, a protective plate, a prism array, a lens array sheet, a light diffusion plate, or a backlight.

<Polarizer>

In the invention, the polarizer used has a thickness of 10 μm or less. In order to reduce the thickness and suppress the occurrence of through cracks, the thickness of the polarizer is preferably 8 μm or less, more preferably 7 μm or less, even more preferably 6 μm or less. On the other hand, the thickness of the polarizer is preferably 2 μm or more, more preferably 3 μm or more. The polarizer with such a small thickness is less uneven in thickness, has good visibility, and is less dimensionally-variable and thus has high durability to thermal shock.

The polarizer is not particularly limited, and it is possible to use any of various polarizers. For example, the polarizer may be a product produced by a process including adsorbing a dichroic material such as iodine or a dichroic dye to a hydrophilic polymer film such as a polyvinyl alcohol-based film, a partially-formalized polyvinyl alcohol-based film, or a partially-saponified, ethylene-vinyl acetate copolymer-based film and uniaxially stretching the film, or may be a polyene-based oriented film such as a film of a dehydration product of polyvinyl alcohol or a dehydrochlorination product of polyvinyl chloride. Among these polarizers, a polarizer including a polyvinyl alcohol-based film and a dichroic material such as iodine is preferred.

For example, a polarizer including a uniaxially-stretched polyvinyl alcohol-based film dyed with iodine can be produced by a process including immersing a polyvinyl alcohol-based film in an aqueous iodine solution to dye the film and stretching the film to 3 to 7 times the original length. If necessary, the film may also be immersed in an aqueous solution of potassium iodide or the like optionally containing boric acid, zinc sulfate, zinc chloride, or other materials. If necessary, the polyvinyl alcohol-based film may be further immersed in water for washing before it is dyed. If the polyvinyl alcohol-based film is washed with water, dirt and any anti-blocking agent can be cleaned from the surface of the polyvinyl alcohol-based film, and the polyvinyl alcohol-based film can also be allowed to swell so that unevenness such as uneven dyeing can be effectively prevented. The film may be stretched before, while, or after it is dyed with iodine. The film may also be stretched in an aqueous solution of boric acid, potassium iodide, or the like or in a water bath.

In view of stretching stability and optical durability, the polarizer preferably contains boric acid. In order to suppress the occurrence of cracks such as through cracks, the content of boric acid in the polarizer is preferably 25% by weight or less, more preferably 20% by weight or less, even more preferably 18% by weight or less, further more preferably 16% by weight or less, based on the total weight of the polarizer. On the other hand, in view of the stretching stability and optical durability of the polarizer, the boron content is preferably 10% by weight or more, more preferably 12% by weight or more, based on the total weight of the polarizer.

Typical examples of the thin polarizer having the thickness of 10 μm or less include the thin polarizers described in, for example, JP-B1-4751486, JP-B1-4751481, JP-B1-4815544, JP-B1-5048120, JP-B1-5587517, WO 2014/077599 A, and WO 2014/077636 A or thin polarizers obtained by the production methods described in these publications.

The polarizer is preferably designed to have a single-body transmittance T and a polarization degree P that represent optical properties satisfying the condition of the following formula: $P > -(10^{0.929T-42.4}-1) \times 100$ (provided that T<42.3) or P≥99.9 (provided that T≥42.3). The polarizer designed to satisfy the condition uniquely has the performance required for a liquid crystal television display having a large display element. Specifically, such a display is required to have a contrast ratio of 1,000:1 or more and a maximum brightness of 500 cd/m$^2$ or more. In other applications, for example, the polarizer is bonded to the viewer side of an organic EL display device.

The thin polarizer described above should be produced by a process capable of achieving high-ratio stretching to improve polarizing performance, among processes including the steps of stretching and dyeing a laminate. From this point of view, the thin polarizer is preferably obtained by a process including the step of stretching in an aqueous boric acid solution as described in JP-B1-4751486, JP-B1-4751481, or JP-B1-4815544, and more preferably obtained by a process including the step of performing auxiliary in-air stretching before stretching in an aqueous boric acid solution as described in JP-B1-4751481 or JP-B1-4815544. These thin polarizers can be obtained by a process including the steps of stretching a laminate of a polyvinyl alcohol-based resin (hereinafter also referred to as PVA-based resin) layer and a stretchable resin substrate and dyeing the laminate.

Using this process, the PVA-based resin layer, even when thin, can be stretched without problems such as breakage by stretching, because the layer is supported on the stretchable resin substrate.

Resin Substrate

The resin substrates used in the production of the thin polarizer can be used for the resin substrates shown in FIGS. 1(A)-2(C) (resin substrate for stretching). Various thermoplastic resins can be used as the forming material for the resin substrate. Examples of the thermoplastic resin include ester-based resins such as polyethylene terephthalate-based resins, cycloolefin-based resins such as norbornene-based resins, olefin-based resins such as polypropylene, polyamide LEO resins, polycarbonate-based resins, and copolymerized resins thereof. Among them, ester-based resins are preferred in view of ease of production and reduction in costs. As the ester-based thermoplastic resin substrate, there can be used a thermoplastic amorphous ester-based resin substrate or a thermoplastic crystalline ester-based resin substrate.

<Transparent Resin Layer>

The thickness of the transparent resin layer is preferably 0.2 μm or more. A compatible layer suitable for suppressing a hue change when displaying black can be easily formed by using a transparent resin layer having such a thickness. The thickness of the transparent resin layer is preferably 0.5 μm or more, more preferably 0.7 μm or more. On the other hand, when a transparent resin layer becomes too thick, the optical reliability and water resistance are lowered. Therefore, the thickness of the transparent resin layer is generally 3 μm or less, preferably 2.5 μm or less, more preferably 2 μm or less, even more preferably 1.5 μm or less. The thickness of the transparent resin layer is the thickness formed on the compatible layer.

The transparent resin layer can be formed from various forming materials. Examples of the material for forming the transparent resin layer include a polyester-based resin, a polyether-based resin, a polycarbonate-based resin, a polyurethane-based resin, a silicone-based resin, a polyamide-based resin, a polyimide-based resin, a PVA-based resin, and an acrylic resin. These resin materials can be used singly or in combination of two or more thereof. In addition, the form of the resin may be either an aqueous form or a solvent-borne form. The form of the resin is preferably an aqueous resin. Among them, a forming material containing a polyvinyl alcohol-based resin or a forming material containing an aqueous emulsion is preferable.

As a material for forming the transparent resin layer, a material that permeates the polarizer is preferably used. As such a material for forming the transparent resin layer, for example, a forming material containing a water-soluble polyvinyl alcohol-based resin as a main component is preferable.

The polyvinyl alcohol-based resin may be, for example, polyvinyl alcohol. Polyvinyl alcohol can be obtained by saponifying polyvinyl acetate. The polyvinyl alcohol-based resin may also be a product produced by saponifying a copolymer of vinyl acetate and a monomer copolymerizable therewith. When the copolymerizable monomer is ethylene, an ethylene-vinyl alcohol copolymer can be obtained. Examples of the copolymerizable monomer include unsaturated carboxylic acids such as maleic acid (anhydride), fumaric acid, crotonic acid, itaconic acid, and (meth)acrylic acid, and esters thereof; α-olefins such as ethylene and propylene; (sodium) (meth)allylsulfonate, sodium sulfonate (monoalkyl maleate), sodium disulfonate alkyl maleate, N-methylolacrylamide, acrylamide alkyl sulfonate alkali salts, N-vinylpyrrolidone, and N-vinylpyrrolidone derivatives. These polyvinyl alcohol-based resins may be used singly or in combination of two or more thereof. From the viewpoint of satisfying moisture heat resistance and water resistance, polyvinyl alcohol obtained by saponifying polyvinyl acetate is preferable.

The polyvinyl alcohol-based resin can have a saponification degree of, for example, 95% by mole or more. In view of satisfying moisture heat resistance and water resistance, the polyvinyl alcohol-based resin preferably has a saponification degree of 99% by mole or more, more preferably 99.7% by mole or more. The saponification degree indicates the proportion of the units actually saponified to vinyl alcohol units in the units capable of being converted to vinyl alcohol units by saponification, and the residues are vinyl ester units. The saponification degree can be determined according to JIS K 6726-1994.

The average polymerization degree of the polyvinyl alcohol-based resin to be used may be, for example, 500 or more. However, from the viewpoint of satisfying moist heat resistance and water resistance, the polyvinyl alcohol-based resin preferably has an average polymerization degree of 1,000 or more, more preferably 1,500 or more, even more preferably 2,000 or more. The average polymerization degree of the polyvinyl alcohol-based resin is measured according to JIS-K 6726.

The polyvinyl alcohol-based resin to be used may also be a modified polyvinyl alcohol-based resin having a hydrophilic functional group on the side chain of the polyvinyl alcohol or copolymerized polyvinyl alcohol. The hydrophilic functional group may be, for example, an acetoacetyl group, a carbonyl group, and the like. In addition, a modified polyvinyl alcohol obtained by acetalization, urethanization, etherification, grafting, phosphoric esterification, or the like of a polyvinyl alcohol-based resin can be used.

The transparent resin layer can be formed from a forming material not containing a curable component. For example, the transparent resin layer can be formed from a forming material containing the polyvinyl alcohol-based resin (PVA-based resin) as a main component. The polyvinyl alcohol-based resin forming the transparent resin layer may be the same as or different from the polyvinyl alcohol-based resin contained in the polarizer, as long as it is a "polyvinyl alcohol-based resin".

The forming material containing the polyvinyl alcohol-based resin as a main component may contain a curable component (crosslinking agent) and the like. The content of the polyvinyl alcohol-based resin in the transparent resin layer or the forming material (solid content) is preferably 80% by weight or more, more preferably 90% by weight or more, even more preferably 95% by weight or more. However, the forming material is preferably free of any curable component (crosslinking agent).

As the crosslinking agent, a compound having at least two functional groups reactive with the polyvinyl alcohol-based resin can be used. Examples of such a compound include alkylenediamines having an alkylene group and two amino groups, such as ethylenediamine, triethylenediamine, and hexamethylenediamine; isocyanates such as tolylene diisocyanate, hydrogenated tolylene diisocyanate, trimethylolpropane tolylene diisocyanate adducts, triphenylmethane triisocyanate, methylene bis(4-phenylmethane triisocyanate, isophorone diisocyanate, and ketoxime blocked compounds thereof or phenol blocked compounds thereof; epoxies such as ethylene glycol diglycidyl ether, polyethylene glycol diglycidyl ether, glycerin di- or tri-glycidyl ether, 1,6- hexanediol diglycidyl ether, trimethylolpropane triglycidyl ether, diglycidyl aniline, and diglycidyl amine; monoaldehydes such as formaldehyde, acetaldehyde, propionaldehyde, and butylaldehyde; dialdehydes such as glyoxal, malondialdehyde, succindialdehyde, glutardialdehyde, maleic dialdehyde, and phthaldialdehyde; amino-formaldehyde resins such as condensates of formaldehyde with methylolurea, methylolmelamine, alkylated methylolurea, alkylated methylolmelamine, acetoguanamine, or benzoguanamine; dicarboxylic acid dihydrazides such as adipic acid dihydrazide, oxalic acid dihydrazide, malonic acid dihydrazide, succinic acid dihydrazide, glutaric acid dihydrazide, isophthalic acid dihydrazide, sebacic acid dihydrazide, maleic acid dihydrazide, fumaric acid dihydrazide, and itaconic acid dihydrazide; water-soluble dihydrazines such as ethylene-1,2-dihydrazine, propylene-1,3-dihydrazine, and butylene-1,4-dihydrazine; and salts of divalent metals or trivalent metals such as sodium, potassium, magnesium, calcium, aluminum, iron, nickel and the like, and oxides thereof. Of these, amino-formaldehyde resins and water-soluble dihydrazines are preferred. The amino-formaldehyde resin is preferably a compound having a methylol group. Methylolmelamine is particularly suitable among the methylol group-containing compounds.

The curable component (crosslinking agent) can be used from the viewpoint of improving water resistance, and the content of the curable component is preferably 20 parts by weight or less, 10 parts by weight or less, or 5 parts by weight or less, per 100 parts by weight of the polyvinyl alcohol-based resin.

The forming material is prepared as a solution obtained by dissolving the polyvinyl alcohol-based resin in a solvent. Examples of the solvent include water, dimethyl sulfoxide, dimethylformamide, dimethylacetamide, N-methylpyrrolidone, various glycols, polyhydric alcohols such as trimethylolpropane, and amines such as ethylenediamine and diethylenetriamine. These solvents can be used singly or in combination of two or more thereof. Among them, an aqueous solution using water as the solvent is preferably used to form the forming material. The concentration of the polyvinyl alcohol-based resin in the forming material (e.g., an aqueous solution) is, but not particularly limited to, 0.1 to 15% by weight, preferably 0.5 to 10% by weight, in view of coatability and storage stability.

In addition, for the formation of the transparent resin layer, a forming material containing an aqueous emulsion resin can be preferably used. Here, the aqueous emulsion resin means resin particles emulsified in water (dispersion medium). The aqueous emulsion resin can be obtained by emulsion polymerization of a monomer component in the presence of an emulsifier. The transparent resin layer can be formed by directly applying a transparent resin layer forming material containing an emulsion containing the aqueous emulsion resin to a polarizer, followed by drying.

The resin constituting the aqueous emulsion resin is not particularly limited, and examples thereof include acryl-based resins, silicone-based resins, polyurethane-based resins, fluorine resins, and the like. Among these, polyurethane-based resins and acryl-based resins are preferred in the present invention from the viewpoint of excellent optical transparency and excellent weather resistance, heat resistance, and the like.

As the aqueous acrylic emulsion resin, a (meth)acrylic polymer obtained by emulsion polymerization of a monomer component containing alkyl (meth)acrylate as a main component in the presence of an emulsifier can be mentioned. In addition, the monomer component preferably contains a carboxyl group-containing monomer. In the present invention, "(meth)acrylate" means "acrylate" and/or "methacrylate", and "(meth)" means the same in the following description.

The alkyl (meth)acrylate is not particularly limited, but an alkyl (meth)acrylate having a linear, branched, or cyclic alkyl group having 2 to 14 carbon atoms can be exemplified.

As the alkyl (meth)acrylate, for example, an alkyl acrylate having an alkyl group of 2 to 14 carbon atoms can be mentioned, and an alkyl acrylate having an alkyl group of 4 to 9 carbon atoms is preferable. Specific examples thereof include an alkyl acrylate having a linear or branched alkyl group, such as n-butyl acrylate, isobutyl acrylate, s-butyl acrylate, isoamyl acrylate, hexyl acrylate, heptyl acrylate, octyl acrylate, 2-ethyihexyl acrylate, isooctyl acrylate, nonyl acrylate, isononyl acrylate, and the like. Of these, n-butyl acrylate is preferred.

Examples of the alkyl (meth)acrylate include an alkyl methacrylate having an alkyl group of 2 to 14 carbon atoms, and an alkyl methacrylate having an alkyl group of 2 to 10 carbon atoms is more preferable. Specific examples thereof include an alkyl methacrylate having a linear or branched alkyl group, such as ethyl methacrylate, propyl methacrylate, isopropyl methacrylate, n-butyl methacrylate, isobutyl methacrylate, s-butyl methacrylate, t-butyl methacrylate and 2-ethylhexyl methacrylate, and an alicyclic alkyl methacrylate, such as cyclohexyl methacrylate, bornyl methacrylate, and isobornyl methacrylate. Of these, methyl methacrylate, ethyl methacrylate, and 2-ethylhexyl methacrylate are preferable.

The alkyl (meth)acrylate may be used singly or in combination of two or more thereof. Among the alkyl (meth)acrylates, an alkyl methacrylate is preferable from the viewpoint of imparting hardness to a polymer forming a transparent resin layer and from adhesiveness of the transparent resin layer obtained.

The content of the alkyl (meth)acrylate is preferably from 70 to 100% by weight, more preferably from 85 to 99% by weight, even more preferably from 87 to 99% by weight, based on the total monomer components (100% by weight) forming the aqueous emulsion resin used in the present invention. Further, from the viewpoint of adhesiveness of the transparent resin layer, the content of the alkyl methacrylate is preferably 30% by weight or more, more preferably 30 to 70% by weight, even more preferably 30 to 65% by weight. In addition, the alkyl acrylate in the monomer component is preferably 70% by weight or less, more preferably 30 to 70% by weight, and even more preferably 35 to 70% by weight.

As the carboxyl group-containing monomer, those having a polymerizable functional group having an unsaturated double bond such as a (meth)acryloyl group or a vinyl group and having a carboxyl group can be used without particular limitation. Examples of the carboxyl group-containing monomer include acrylic acid, methacrylic acid, carboxyethyl (meth)acrylate, carboxypentyl (meth)acrylate, itaconic acid, maleic acid, fumaric acid, crotonic acid, and the like, and these monomers can be used singly or in combination thereof. Of these, acrylic acid and methacrylic acid are preferable, and methacrylic acid is more preferable.

The carboxyl group-containing monomer is preferably used in a proportion of 0.5 to 10 parts by weight, more preferably 0.5 to 8 parts by weight, even more preferably 1 to 8 parts by weight, based on 100 parts by weight of the alkyl (meth)acrylate having an alkyl group of 2 to 14 carbon atoms. When the proportion of the carboxyl group-containing monomer exceeds 10 parts by weight, decrease in dispersion stability during polymerization and increase in the viscosity of aqueous dispersion become remarkable, resulting in a tendency to affect the coating, which is not preferable.

In addition to the alkyl (meth)acrylate and the carboxyl group-containing monomer, a monomer copolymerizable with the alkyl (meth)acrylate can be used as the monomer component.

The copolymerizable monomer is not particularly limited as long as it has a polymerizable functional group related to an unsaturated double bond, such as a (meth)acryloyl group or a vinyl group, and examples thereof include an alkyl (meth)acrylate having an alkyl group of 1 or 15 or more carbon atoms; aryl (meth)acrylate such as phenyl (meth) acrylate; vinyl esters such as vinyl acetate and vinyl propionate; styrene-based monomers such as styrene; epoxy group-containing monomers such as glycidyl (meth)acrylate and methylglycidyl (meth)acrylate; hydroxyl group-containing monomers such as 2-hydroxyethyl acrylate and 2-hydroxypropyl acrylate; nitrogen atom-containing monomers such as (meth)acrylamide, N,N-dimethyl (meth)acrylamide, N,N-diethyl (meth)acrylamide, N-isopropyl (meth)acrylamide, N-butyl (meth)acrylamide, N-methylol (meth)acrylamide, N-methylolpropane (meth)acrylamide, (meth)acryloyl morpholine, aminoethyl (meth)acrylate, N,N-dimethylaminoethyl (meth)acrylate, and t-butylaminoethyl (meth)acrylate; alkoxy group-containing monomers such as methoxyethyl (meth)acrylate and ethoxyethyl (meth)acrylate; cyano group-containing monomers such as acrylonitrile and methacrylonitrile; functional monomers such as 2-methacryloyloxyethyl isocyanate; olefinic monomers such as ethylene, propylene, isoprene, butadiene and isobutylene; vinyl ether-based monomers such as vinyl ether; halogen-containing monomers such as vinyl chloride; in addition, vinyl group-containing heterocyclic compounds such as N-vinylpyrrolidone, N-(1-methylvinyl)pyrrolidone, N-vinylpyridine, N-vinylpiperidone, N-vinylpyrimidine, N-vinylpiperazine, N-vinylpyrazine, N-vinylpyrrole, N-vinylimidazole, N-vinyloxazole and N-vinylmorpholine, and N-vinylcarboxylic acid amides, and the like.

Examples of the copolymerizable monomers include maleimide-based monomers such as N-cyclohexylmaleimide, N-isopropylmaleimide, N-laurylmaleimide and N-phenylmaleimide; itaconimide-based monomers such as N-methyl itaconimide, N-ethyl itaconimide, N-butyl itaconimide, N-octyl itaconimide, N-2-ethylhexyl itaconimide, N-cyclohexyl itaconimide, and N-lauryl itaconimide; succinimide-based monomers such as N-(meth)acryloyloxymethylene succinimide, N-(meth)acryloyl-6-oxyhexamethylene succinimide, and N-(meth)acryloyl-8-oxyoctamethylene succinimide; sulfonic acid group-containing monomers such as styrenesulfonic acid, allylsulfonic acid, 2-(meth)acrylamido-2-methylpropanesulfonic acid, (meth)acrylamidopropanesulfonic acid, sulfopropyl (meth)acrylate, (meth)acryloyloxynaphthalenesulfonic acid; and the like.

Also, as the copolymerizable monomer, a phosphoric acid group-containing monomer can be mentioned. Examples of the phosphoric acid group-containing monomer include compounds represented by the following general formula (1):

[Formula]

(In the formula, $R^1$ represents a hydrogen atom or a methyl group, $R^2$ represents an alkylene group having 1 to 4 carbon atoms, m represents an integer of 2 or more, $M^1$ and $M^2$ each independently represent a hydrogen atom or a cation.)

In the general formula (1), m is an integer of 2 or more, preferably an integer of 4 or more, and is preferably an integer of usually 40 or less. The integer "m" represents a polymerization degree of the oxyalkylene group. Examples of the polyoxyalkylene group include a polyoxyethylene group, a polyoxypropylene group, and the like, and these polyoxyalkylene groups may be random, block or graft units thereof. The cation related to the salt of the phosphoric acid group is not particularly limited, and examples thereof include inorganic cations such as alkali metals (e.g. sodium, potassium, etc.), alkaline earth metals (e.g. calcium, magnesium, etc.), organic cations (e.g. quaternary amines, etc.), and the like.

In addition, examples of the copolymerizable monomers include glycol-based acrylic ester monomers such as polyethylene glycol (meth)acrylate, polypropylene glycol (meth) acrylate, methoxyethylene glycol (meth)acrylate, and methoxypolypropylene glycol (meth)acrylate; and other examples include heterocycles (e.g. tetrahydrofurfuryl (meth)acrylate), acrylic ester monomers containing a halogen atom (e.g. fluorine (meth)acrylate, etc.), and the like.

Further, as the copolymerizable monomer, a polyfunctional monomer can be used for adjusting the gel fraction of the transparent resin layer-forming material or the like. Examples of the polyfunctional monomer include a compound having two or more unsaturated double bonds such as a (meth)acryloyl group and a vinyl group. Such polyfunctional monomers include (mono or poly)alkylene glycol di(meth)acrylates such as (mono or poly)ethylene glycol di(meth)acrylate (e.g. ethylene glycol di(meth)acrylate, diethylene glycol di(meth)acrylate, triethylene glycol di(meth)acrylate, trimethylolpropane tri(meth)acrylate, tetraethylene glycol di(meth)acrylate, etc.) and (mono or poly)propylene glycol di(meth)acrylates (e.g. propylene glycol di(meth)acrylate, etc.); in addition, esterified products of (meth)acrylic acid and a polyvalent alcohol, such as neopentylglycol di(meta)acrylate, 1,6-hexanediol di(meta)acrylate, pentaerythritol di(meta)acrylate, trimethylolpropane tri(meta)acrylate, pentaerythritol tri(meta)acrylate, dipentaerythritol hexa(meta)acrylate; polyfunctional vinyl compounds such as divinylbenzene; compounds having a reactive unsaturated double bond, such as allyl (meth)acrylate and vinyl (meth)acrylate, and the like. As the polyfunctional monomer, it may also be possible to use a polyester (meth)acrylate, an epoxy (meth)acrylate, a urethane (meth)acrylate, and the like in which two or more unsaturated double bonds such as (meth)acryloyl group, vinyl group, etc. are added to a skeleton of polyester, epoxy, urethane or the like as a functional group similar to the monomer component.

The proportion of the copolymerizable monomer other than the carboxyl group-containing monomer is preferably 40 parts by weight or less, more preferably 30 parts by weight or less, even more preferably 20% by weight or less, particularly preferably 10% parts by weight or less, based on 100 parts by weight of the alkyl (meth)acrylate having an alkyl group of 2 to 14 carbon atoms.

The emulsion polymerization of the monomer component can be carried out by polymerizing the monomer component in the presence of an emulsifier. Thereby, an aqueous acrylic emulsion containing the (meth)acrylic polymer dispersed therein can be prepared. In the emulsion polymerization, for example, an emulsifying agent, a radical polymerization initiator, and optionally a chain transfer agent or the like may be appropriately blended in water together with the monomer component. More specifically, a heretofore-known emulsion polymerization process such as a batch mixing process (batch polymerization process), a monomer dropping process or a monomer emulsion dropping process may be employed. In the monomer dropping process, continuous dropping or divided dropping is appropriately selected. These processes may be appropriately combined. The reaction conditions or the like may be appropriately selected. For example, the polymerization temperature is preferably in the range of about 20 to 90° C., and the polymerization time is preferably in the range of about 30 minutes to 24 hours.

The surfactant (emulsifying agent) for use in emulsion polymerization is not particularly limited, and it is possible to use any of various surfactants commonly used in emulsion polymerization. For example, as the surfactant, it is possible to use an anionic surfactant or a nonionic surfactant. Specific examples of the anionic surfactant include higher fatty acid salts such as sodium oleate; alkylarylsulfonate salts such as sodium dodecylbenzenesulfonate; alkylsulfate ester salts such as sodium laurylsulfate and ammonium laurylsulfate; polyoxyethylene alkyl ether sulfate ester salts such as sodium polyoxyethylene lauryl ether sulfate; polyoxyethylene alkyl aryl ether sulfate ester salts such as sodium polyoxyethylene nonyl phenyl ether sulfate; alkyl sulfosuccinic acid ester salts such as sodium monooctyl sulfosuccinate, sodium dioctyl sulfosuccinate, and sodium polyoxyethylene lauryl sulfosuccinate, and derivatives thereof; polyoxyethylene distyrenated phenyl ether sulfate ester salts; sodium naphthalene sulfonate formalin condensate; and the like. Specific examples of the nonionic surfactant include polyoxyethylene alkyl ethers such as polyoxyethylene lauryl ether and polyoxyethylene stearyl ether; polyoxyethylene alkyl phenyl ethers such as polyoxyethylene octyl phenyl ether and polyoxyethylene nonyl phenyl ether; sorbitan higher fatty acid esters such as sorbitan monolaurate, sorbitan monostearate, and sorbitan trioleate; polyoxyethylene sorbitan higher fatty acid esters such as polyoxyethylene sorbitan monolaurate; polyoxyethylene higher fatty acid esters such as polyoxyethylene monolaurate and polyoxyethylene monostearate; glycerin higher fatty acid esters such as oleic acid monoglyceride and stearic acid monoglyceride; polyoxyethylene-polyoxypropylene block copolymers; and polyoxyethylene distyrenated phenyl ether; and the like.

In addition to the non-reactive surfactants, it is possible to use, as the surfactant, a reactive surfactant having a radically-polymerizable functional group pertaining to an ethylenic unsaturated double bond. Examples of the reactive surfactant include a radically-polymerizable surfactant obtained by introducing a radically-polymerizable functional group (radically reactive group) such as a propenyl group or an allyl ether group, into the anionic surfactant or the nonionic surfactant. These surfactants may be appropriately used singly or in combination thereof. Among these surfactants, from a viewpoint of stability of an aqueous dispersion, and durability of the pressure-sensitive adhesive layer, it is preferable to use the radically-polymerizable surfactant having a radically-polymerizable functional group.

Specific examples of the anionic reactive surfactant include alkyl ether-based surfactants (examples of commercially available products include AQUALON KH-05, KH-10 and KH-20 manufactured by Dai-ichi Kogyo Seiyaku Co., Ltd., ADEKA REASOAP SR-10N and SR-20N manufactured by ADEKA CORPORATION, and LATEMUL PD-104 manufactured by Kao Corporation); sulfosuccinic acid ester-based surfactants (examples of commercially available products include LATEMUL S-120, S-120A, S-180P, and S-180A manufactured by Kao Corporation, and ELEMINOL JS-2 manufactured by Sanyo Chemical Industries, Ltd.); alkyl phenyl ether-based or alkyl phenyl ester-based surfactants (examples of commercially available products include AQUALON H-2855A, H-3855B, H-3855C, H-3856, HS-05, HS-10, HS-20, HS-30, BC-05, BC-10 and BC-20 manufactured by Dai-ichi Kogyo Seiyaku Co., Ltd., and ADEKA REASOAP SDX-222, SDX-223, SDX-232, SDX-233, SDX-259, SE-10N and SE-20N manufactured by ADEKA CORPORATION); (meth)acrylate sulfate ester-based surfactants (examples of commercially available products include ANTOX MS-60 and MS-2N manufactured by Nippon Nyukazai Co., Ltd., and ELEMINOL RS-30 manufactured by Sanyo Chemical Industries Co., Ltd.); and phosphoric acid ester-based surfactants (examples of commercially available products include H-3330PL manufactured by Dai-ichi Kogyo Seiyaku Co., Ltd., and ADEKA REASOAP PP-70 manufactured by ADEKA CORPORATION). Examples of the nonionic reactive surfactants include alkyl ether-based surfactants (examples of commercially available products include ADEKA REASOAP ER-10, ER-20, ER-30 and ER-40 manufactured by ADEKA CORPORATION, and LATEMUL PD-420, PD-430 and PD-450 manufactured by Kao Corporation); alkyl phenyl ether-based or alkyl phenyl ester-based surfactants (examples of commercially available products include AQUALON RN-10, RN-20, RN-30 and RN-50 manufactured by Dai-ichi Kogyo Seiyaku Co., Ltd., and ADEKA REASOAP NE-10, NE-20, NE-30 and NE-40 manufactured by ADEKA CORPORATION); and (meth)acrylate sulfate ester-based surfactants (examples of commercially available products include RMA-564, RMA-568 and RMA-1114 manufactured by Nippon Nyukazai Co., Ltd).

The blending ratio of the surfactant is preferably 0.3 to 5 parts by weight, more preferably 0.3 to 4 parts by weight, based on 100 parts by weight of the monomer component. It is possible to improve the polymerization stability, the mechanical stability and the like by selecting such a blending ratio of the surfactant.

The radical polymerization initiator is not particularly limited, and it is possible to use any of various heretofore-known radical polymerization initiators commonly used in emulsion polymerization. Examples thereof include azo-based initiators such as 2,2'-azobisisobutylonitrile, 2,2'-azobis(2-methylpropionamidine) disulfate, 2,2'-azobis(2-methylpropionamidine) dihydrochloride, 2,2'-azobis(2-amidinopropane) dihydrochloride, and 2,2'-azobis[2-(2-imidazolin-2-yl)propane] dihydrochloride; persulfate-based initiators such as potassium persulfate and ammonium persulfate; peroxide-based initiators such as benzoyl peroxide, t-butyl hydroperoxide, and hydrogen peroxide; substituted ethane-based initiators such as phenyl-substituted ethane; and carbonyl-based initiators such as aromatic carbonyl compounds. These polymerization initiators may be appropriately used singly or in combination of two or more thereof. In the emulsion polymerization, a redox system initiator using a reducing agent in combination with the polymerization initiator may be employed, if desired. This makes it easier to promote the emulsion polymerization rate and to perform emulsion polymerization at a low temperature. Examples of such a reducing agent include reducing organic compounds such as ascorbic acid, erythorbic acid, tartaric acid, citric acid, glucose, and metal salts of formaldehyde sulfoxylate or the like; reducing inorganic compounds such as sodium thiosulfate, sodium sulfite, sodium bisulfite, and sodium metabisulfite; and ferrous chloride; Rongalite; and thiourea dioxide; and the like.

The blending ratio of the radical polymerization initiator is typically from about 0.02 to about 1 part by weight, preferably from 0.02 to 0.5 parts by weight, more preferably from 0.05 to 0.3 parts by weight, based on 100 parts by weight of the monomer components, while it is appropriately selected. If the blending ratio of the radical polymerization initiator is less than 0.02 parts by weight, the radical polymerization initiator may be less effective. When it exceeds 1 part by weight, the molecular weight of the (meth)acrylic polymer related to the transparent resin layer-forming material lowers to result in the deterioration of the durability of the transparent resin layer-forming material. In the case of a redox type initiator, the reducing agent is preferably used in an amount of 0.01 to 1 part by weight based on 100 parts by weight of the total amount of the monomer components.

Any chain transfer agent commonly used in emulsion polymerization may be used as needed to control the molecular weight of a (meth)acrylic polymer. Examples of the chain transfer agent include mercaptans such as 1-dodecanethiol, mercaptoacetic acid, 2-mercaptoethanol, 2-ethylhexyl thioglycolate, 2,3-dimercapto-1-propanol, mercaptopropionic acid esters, and the like. These chain transfer agents may be appropriately used singly or in combination thereof. In addition, the blending ratio of the chain transfer agent is, for example, 0.3 parts by weight or less, preferably 0.001 to 0.3 parts by weight, based on 100 parts by weight of the monomer component.

By such emulsion polymerization, an emulsion containing (meth)acrylic polymer particles (contained as emulsion particles) can be prepared. The average particle diameter of such an emulsion type (meth)acrylic polymer is preferably adjusted to, for example, about 0.05 to 3 μm, more preferably 0.05 to 1 μm. When the average particle diameter is smaller than 0.05 μm, the viscosity of the transparent resin layer-forming material may increase, and when it is larger than 1 μm, the fusibility between the particles may decrease to result in reduction of the cohesive force.

Also, in order to maintain the dispersion stability of the emulsion, when the (meth)acrylic polymer related to the emulsion contains a carboxyl group-containing monomer or the like as a copolymerizable monomer, it is preferable to neutralize the carboxyl group-containing monomer or the like. The neutralization can be carried out, for example, with ammonia, an alkali metal hydroxide or the like.

The (meth)acrylic polymer that is an aqueous emulsion resin of the present invention usually has a weight average molecular weight of preferably 100,000 or more, more preferably 100,000 to 4,000,000 from the viewpoint of heat resistance and moisture resistance. However, the pressure-sensitive adhesive obtained by the emulsion polymerization usually has a high gel content and cannot be measured by GPC (gel permeation chromatography), which means that it is often difficult to identify the molecular weight by actual measurement.

The glass transition temperature (Tg) of the (meth)acrylic polymer that is an aqueous emulsion resin of the present invention is not particularly limited, but it is preferably 0 to 120° C., more preferably 10 to 80° C. It is preferable from the viewpoint of the heat resistance of the polarizing plate that the glass transition temperature (Tg) of the (meth)acrylic polymer is within the above range.

The polyurethane resin that can be used as an aqueous emulsion resin includes a polyurethane resin or a urethane prepolymer. The polyurethane resin is a polyurethane obtained by using a polyol component and a polyisocyanate component as main components or a modified product thereof. Generally, the urethane prepolymer is composed mainly of a polyol component and a polyisocyanate component and has an isocyanate group or a blocked isocyanate group at the terminal.

Examples of the polyol component include polyether polyols such as polyethylene glycol, polypropylene glycol and polyoxytetramethylene ether glycol, obtained by ring-opening polymerization of ethylene oxide, propylene oxide, tetrahydrofuran or the like; various known saturated or unsaturated low molecular weight glycols such as ethylene glycol, diethylene glycol, triethylene glycol, 1,2-propanediol, 1,3-propanediol, 1,3-butanediol, 1,4-butanediol, neopentyl glycol, pentanediol, 3-methyl-1,5-pentanediol, 1,6-hexanediol, octanediol, 1,4-butynediol, dipropylene glycol, bisphenol A, bisphenol A propylene oxide adduct, bisphenol A ethylene oxide adduct, and hydrogenated bisphenol A; furthermore, polyester polyols obtained by dehydrating condensation of the low molecular glycol and dibasic acid (e.g. adipic acid, maleic acid, fumaric acid, phthalic anhydride, isophthalic acid, terephthalic acid, succinic acid, oxalic acid, malonic acid, glutaric acid, pimelic acid, azelaic acid, sebacic acid, suberic acid, etc.) or the corresponding acid anhydrides thereof; polyester polyols obtained by ring-opening polymerization of lactones such as s-caprolactone and β-methyl-δ-valerolactone; various known polymer polyols used generally in the production of polyurethanes, such as other polycarbonate polyols and polybutadiene glycols; and the like. Incidentally, it is also possible to use various polyols such as glycerin, trimethylolpropane, trimethylolethane, 1,2,6-hexanetriol, 1,2,4-butanetriol, pentaerythritol, and sorbitol as a part of the low molecular weight glycol component.

Further, as the polyisocyanate compound, various known diisocyanates such as aromatic, aliphatic or alicyclic compounds can be used. Typical examples thereof include 1,5-naphthylene diisocyanate, 4,4'-diphenylmethane diisocyanate, 4,4'-diphenyldimethylmethane diisocyanate, 4,4'-dibenzyl isocyanate, dialkyl diphenylmethane diisocyanate, tetraalkyl diphenylmethane diisocyanate, 1,3-phenylene diisocyanate, 1,4-phenylene diisocyanate, tolylene diisocyanate, butane-1,4-diisocyanate, hexamethylene diisocyanate, isopropylene diisocyanate, methylene diisocyanate, 2,2,4-trimethylhexamethylene diisocyanate, 2,4,4-trimethylhexamethylene diisocyanate, cyclohexane-1,4-diisocyanate, xylylene diisocyanate, isophorone diisocyanate, lysine diisocyanate, dicyclohexylmethane-4,4'-diisocyanate, 1,3-bis (isocyanatomethyl) cyclohexane, methylcyclohexane diisocyanate, m-tetramethylxylylene diisocyanate and dimer diisocyanate obtained by converting carboxyl groups of dimer acid into isocyanate groups.

Incidentally, examples of the blocking agent for isocyanate groups include bisulfite salts, phenols containing sulfonic acid groups, alcohols, lactams oximes, and active methylene compounds.

In the present invention, the polyurethane-based resin can be used as an aqueous emulsion resin, but the aqueous dispersibility or solubility in the polyurethane-based resin can be achieved by, for example, introducing a hydrophilic group such as a carboxylate salt group into the polyurethane resin or a urethane prepolymer or using a polyol component having a hydrophilic moiety such as an ethylene oxide adduct.

Examples of the aqueous polyurethane resin include SUPERFLEX 150, SUPERFLEX 820, SUPERFLEX 870, and the like manufactured by Dai-ichi Kogyo Seiyaku Co., Ltd.

In addition, the aqueous emulsion coating liquid may contain a film-forming aid. The film-forming aid is not particularly limited, but for example, it may be a glycol ether-based solvent represented by the following general formula (2):

$$R^3-(CO)_n-(OA)_n-OR^4$$

wherein $R^3$ is a hydrogen atom or a hydrocarbon group having 1 to 10 carbon atoms, $R^4$ is a hydrocarbon group having 1 to 10 carbon atoms, A is an alkylene group having 2 or 3 carbon atoms, n is an integer of 1 to 60, and m is 0 or 1, provided that the glycol ether-based solvent when $R^3$ is a hydrogen atom and m is 1 is excluded. Examples of the hydrocarbon group having 1 to 10 carbon atoms as $R^3$ and $R^4$ include a linear, branched or cyclic alkyl or alkenyl group, an aromatic group, and a combination thereof. OA is an oxyethylene group or an oxypropylene group, and these may be in the form of a random body or a block body when mixed. Specific examples of the glycol ether-based solvent represented by the general formula (2) include diethylene glycol monobutyl ether acetate, polypropylene glycol monomethyl ether, polyethylene glycol monophenyl ether, triethylamine, texanol, and the like.

The blending ratio of the film-forming aid is preferably 0.1 to 15 parts by weight, more preferably 0.5 to 10 parts by weight, based on 100 parts by weight of the aqueous emulsion resin (solid content).

The transparent resin layer-forming material containing the aqueous emulsion resin used in the present invention can be obtained by, for example, mixing the film-forming aid with the aqueous dispersion of the water dispersion type acrylic resin.

The solid concentration of the transparent resin layer-forming material used in the present invention is preferably 10% by weight or more, more preferably 30% by weight or more.

If necessary, the transparent resin layer-forming material of the present invention may further appropriately contain any of various additives such as crosslinking agents, viscosity adjusting agents, releasing adjusting agents, plasticizers, softeners, fillers including glass fibers, glass beads, metal power, or any other inorganic powder, pigments, colorants (pigments, dyes, etc.), pH adjusting agents (acids or bases), antioxidants, ultraviolet ray absorbing agents, and silane coupling agents, without departing from the objects of the present invention. These additives may also be blended in the form of an emulsion.

The transparent resin layer can be formed by applying the forming material to the surface of a polarizer (for example, a surface not having a resin substrate), followed by drying. The application of the forming material is preferably performed so that the thickness of the forming material after drying is from 0.2 μm to 3 μm. The coating operation is not particularly limited, and any appropriate method can be adopted. For example, various means such as a roll coating method, a spin coating method, a wire bar coating method, a dip coating method, a die coating method, a curtain coating method, a spray coating method, and a knife coating method (a comma coating method, etc.) may be adopted. The drying temperature is usually preferably from 60 to 120° C., more preferably from 70 to 100° C. The drying time is preferably from 10 to 300 seconds, more preferably from 20 to 120 seconds.

<Low Reflection Treatment Layer>

The low reflection treatment layer can be formed by various means. The polarizing film of the present invention is suitable for suppressing hue change when displaying black in the case where the reflectance of the low reflection treatment layer is 2% or less. The reflectance is preferably 1.8% or less, more preferably 1.5% or less. Measurement of reflectance is as described in Examples.

As a forming material for the low reflection treatment layer, for example, a compound having a siloxane component can be mentioned. As such a compound, for example, a hydrolyzable alkoxysilane can be mentioned. Further, as a forming material for the low reflection treatment layer, a compound having a fluoroalkyl structure and a polysiloxane structure can be mentioned. As a forming material for the low reflection treatment layer, an inorganic material such as titanium oxide, zirconium oxide, silicon oxide, and magnesium fluoride can be used. The inorganic material can be used in the form of inorganic fine particles. These materials can be used in combination thereof.

In addition, the low reflection treatment layer can be formed of a single layer but can be designed with a plurality of layers. Further, the low reflection treatment layer can be used as being provided on a substrate film or a transparent substrate. In addition, the low reflection treatment layer can be formed on a hard coat layer substrate, so that an anti-reflection effect can be exhibited. Further, the low reflection treatment layer can be provided on an antiglare treatment layer for the purpose of improving visibility. The thickness of the low reflection treatment layer is not particularly limited but is usually about 0.1 to 15 μm.

<Substrate Film>

The material constituting the substrate film includes preferably a material having a high level of transparency, mechanical strength, thermal stability, water barrier properties, isotropy, and the like. Examples of such a material include polyester-based polymers such as polyethylene terephthalate and polyethylene naphthalate, cellulose-based polymers such as diacetyl cellulose and triacetyl cellulose, acrylic polymers such as polymethyl methacrylate, styrene-based polymers such as polystyrene and acrylonitrile-styrene copolymers (AS resins), and polycarbonate-based polymers. Examples of polymers that may be also used to form the protective film include polyolefins such as polyethylene and polypropylene, polyolefin having a cyclic structure or a norbornene structure, polyolefin-based polymers such as ethylene-propylene copolymers, vinyl chloride-based polymers, amide-based polymers such as nylon and aromatic polyamide, imide-based polymers, sulfone-based polymers, polyether sulfone-based polymers, polyether ether ketone-based polymers, polyphenylene sulfide-based polymers, vinyl alcohol-based polymers, vinylidene chloride-based polymers, vinyl butyral-based polymers, arylate-based polymers, polyoxymethylene-based polymers, epoxy-based polymers, or any blends of the above polymers.

The substrate film may also contain any type of one or more appropriate additives. Examples of such additives include ultraviolet absorbers, antioxidants, lubricants, plasticizers, release agents, coloring inhibitors, flame retardants, nucleating agents, antistatic agents, pigments, and colorants. The content of the thermoplastic resin in the protective film is preferably from 50 to 100% by weight, more preferably from 50 to 99% by weight, even more preferably from 60 to 98% by weight, particularly preferably from 70 to 97% by weight. If the content of the thermoplastic resin in the substrate film is 50% by weight or less, high transparency and other properties inherent in the thermoplastic resin may not be sufficiently exhibited.

The thickness of the substrate film may be appropriately determined. In general, the thickness of the substrate film is from about 1 to about 500 μm in view of strength, workability such as handleability, and thin layer formability. In particular, the thickness of the substrate film is particularly suitable in the case of preferably from 1 to 300 μm, more preferably from 5 to 200 μm, even more preferably from 5 to 150 μm, especially preferably from 20 to 100 μm.

A functional layer such as a hard coat layer, an antireflection layer, an anti-sticking layer, a diffusion layer or an antiglare layer can be provided on the surface of the substrate film on which the first transparent resin layer is not adhered. The functional layers such as a hard coat layer, an antireflection layer, an anti-sticking layer, a diffusion layer and an antiglare layer can be provided on the protective film itself or as a layer independent of the protective film.

<Intervening Layer>

The substrate film and the first transparent resin layer are laminated with an intervening layer, such as an adhesive layer, a pressure-sensitive adhesive layer, or an undercoat layer (primer layer), between them. In this case, the intervening layer should preferably be used to laminate them with no air gap between them.

The adhesive layer is made from an adhesive. Any of various types of adhesives may be used. The adhesive layer may be of any optically-transparent type. The adhesive may be any of various types, such as a water-based adhesive, a solvent-based adhesive, a hot melt-based adhesive, and an active energy ray-curable adhesive. A water-based adhesive or an active energy ray-curable adhesive is preferred.

The water-based adhesive may be, for example, an isocyanate-based adhesive, a polyvinyl alcohol-based adhesive, a gelatin-based adhesive, a vinyl-based adhesive, a latex-based adhesive, or a water-based polyester adhesive. The water-based adhesive is generally used in the form of an aqueous solution, which generally has a solids content of 0.5 to 60% by weight.

The active energy ray-curable adhesive is an adhesive capable of being cured by exposure to active energy rays such as electron beams or ultraviolet rays (a radically or cationically curable adhesive). The active energy ray-curable adhesive to be used may be of, for example, an electron beam-curable type or an ultraviolet-curable type. The active energy ray-curable adhesive may be, for example, a photo-radically curable adhesive. The photo-radically curable type active energy ray-curable adhesive may be of an ultraviolet-curable type. In this case, the adhesive should contain a radically polymerizable compound and a photopolymerization initiator.

The method for applying the adhesive is appropriately selected depending on the viscosity of the adhesive and the desired thickness. Examples of application means include a reverse coater, a gravure coater (direct, reverse, or offset), a bar reverse coater, a roll coater, a die coater, a bar coater, and a rod coater. Any other suitable application method such as dipping may also be used.

For example, when the water-based adhesive is used, the adhesive is preferably applied in such a manner that the finally formed adhesive layer can have a thickness of 30 to 300 nm. The adhesive layer more preferably has a thickness of 60 to 250 nm. On the other hand, when the active energy ray-curable adhesive is used, the adhesive layer is preferably formed with a thickness of 0.1 to 200 μm. The thickness is more preferably from 0.5 to 50 μm, even more preferably from 0.5 to 10 μm.

In the process of laminating the polarizer and the protective film, an adhesion-facilitating layer may be placed between the protective film and the adhesive layer. The adhesion-facilitating layer may be made of, for example, any of various resins having a polyester skeleton, a polyether skeleton, a polycarbonate skeleton, a polyurethane skeleton, a silicone skeleton, a polyamide skeleton, a polyimide skeleton, a polyvinyl alcohol skeleton, or other polymer skeletons. These polymer resins may be used singly or in combination of two or more. Other additives may also be added to form the adhesion-facilitating layer. More specifically, a tackifier, an ultraviolet absorber, an antioxidant, or a stabilizer such as a heat-resistant stabilizer may also be used to form the adhesion-facilitating layer.

The adhesion-facilitating layer is usually provided in advance on the protective film, and then the adhesion-facilitating layer side of the protective film is bonded to the polarizer with the adhesive layer. The adhesion-facilitating layer can be formed using a known technique that includes applying an adhesion-facilitating-layer-forming material onto the protective film and drying the material. The adhesion-facilitating-layer-forming material is generally prepared in the form of a solution which is diluted to a suitable concentration taking into account the coating thickness after drying, the smoothness of the application, and other factors. After dried, the adhesion-facilitating layer preferably has a thickness of 0.01 to 5 μm, more preferably 0.02 to 2 μm, even more preferably 0.05 to 1 μm. Two or more adhesion-facilitating layers may be provided. Also in this case, the total thickness of the adhesion-facilitating layers preferably falls within these ranges.

The pressure-sensitive adhesive layer is made from a pressure-sensitive adhesive. Any of various pressure-sensitive adhesives may be used, examples of which include rubber-based pressure-sensitive adhesives, acryl-based pressure-sensitive adhesives, silicone-based pressure-sensitive adhesives, polyurethane-based pressure-sensitive adhesives, vinyl alkyl ether-based pressure-sensitive adhesives, polyvinylpyrrolidone-based pressure-sensitive adhesives, polyacrylamide-based pressure-sensitive adhesives, and cellulose-based pressure-sensitive adhesives. The base polymer with adhesive properties is selected depending on the type of the pressure-sensitive adhesive. Among these pressure-sensitive adhesive adhesives, acryl-based pressure-sensitive adhesives are preferably used because they have a high level of optical transparency, weather resistance, heat resistance, and other properties, and exhibit an appropriate level of wettability and adhesive properties including cohesiveness and adhesiveness.

The undercoat layer (primer layer) is formed to improve the adhesion between the polarizer and the protective film. The primer layer may be made of any material capable of providing somewhat strong adhesion to both the base film and a polyvinyl alcohol-based resin layer. For example, a thermoplastic resin having a high level of transparency, thermal stability, and stretchability may be used to form the primer layer. Such a thermoplastic resin may be, for example, an acryl-based resin, a polyolefin-based resin, a polyester-based resin, a polyvinyl alcohol-based resin, or any mixture thereof.

<Pressure-Sensitive Adhesive Layer>

The polarizing film may be provided with a pressure-sensitive adhesive layer and used as a pressure-sensitive-adhesive-layer-attached polarizing film. The pressure-sensitive adhesive layer can be provided on the side where the first transparent resin layer of the polarizing film is not provided. In the case of having a substrate film, a pressure-sensitive adhesive layer can be provided on the substrate film (pressure-sensitive adhesive layer 5 in FIG. 2(C)). A separator can be provided on the pressure-sensitive adhesive layer of the pressure-sensitive-adhesive-layer-attached polarizing film.

The pressure-sensitive adhesive layer may be formed using any appropriate type of pressure-sensitive adhesive. Examples of the pressure-sensitive adhesive include a rubber-based pressure-sensitive adhesive, an acryl-based pressure-sensitive adhesive, a silicone-based pressure-sensitive adhesive, a urethane-based pressure-sensitive adhesive, a vinyl alkyl ether-based pressure-sensitive adhesive, a polyvinyl alcohol-based pressure-sensitive adhesive, a polyvinylpyrrolidone-based pressure-sensitive adhesive, a polyacrylamide-based pressure-sensitive adhesive, and a cellulose-based pressure-sensitive adhesive.

Among these pressure-sensitive adhesives, those having a high level of optical transparency and weather resistance or heat resistance and exhibiting an appropriate level of wettability and adhesive properties such as cohesiveness and adhesiveness are preferably used. An acryl-based pressure-sensitive adhesive is preferably used because it has such properties.

The pressure-sensitive adhesive layer can be formed by a method including applying the pressure-sensitive adhesive to a release-treated separator or the like, removing the polymerization solvent and other components from the adhesive by drying to form a pressure-sensitive adhesive layer, and then transferring the pressure-sensitive adhesive layer onto the polarizing film. Alternatively, the pressure-sensitive adhesive layer can be formed by a method comprising applying directly the pressure-sensitive adhesive, removing the polymerization solvent and the like under drying to form a pressure-sensitive adhesive layer on the polarizer or the like. In applying the pressure-sensitive adhesive, one or more solvents other than the polymerization solvent may be newly added as appropriate.

A silicone release liner is preferably used as the release-treated separator. In the invention, the pressure-sensitive adhesive may be applied to such a liner and then dried to form a pressure-sensitive adhesive layer. In this process, any appropriate method may be used for drying the pressure-sensitive adhesive, depending on purpose. Preferably, a method of heating and drying the coating film is used. The heating and drying temperature is preferably from 40° C. to 200° C., more preferably from 50° C. to 180° C., even more preferably from 70° C. to 170° C. When the heating temperature is set in the range, a pressure-sensitive adhesive with a high level of adhesive properties can be obtained.

Any appropriate drying time may be used as needed. The drying time is preferably from 5 seconds to 20 minutes, more preferably from 5 seconds to 10 minutes, even more preferably from 10 seconds to 5 minutes.

Various methods may be used to form the pressure-sensitive adhesive layer. Examples of such methods include roll coating, kiss roll coating, gravure coating, reverse coating, roll brush coating, spray coating, dip roll coating, bar coating, knife coating, air knife coating, curtain coating, lip coating, and extrusion coating with a die coater or other means.

The thickness of the pressure-sensitive adhesive layer is typically, but not limited to, about 1 to about 100 µm, preferably 2 to 50 µm, more preferably 2 to 40 µm, even more preferably 5 to 35 µm.

When the pressure-sensitive adhesive layer is exposed, the pressure-sensitive adhesive layer may be protected by a release-treated sheet (separator) until it is actually used.

Examples of the material used to form such a separator include a plastic film such as a polyethylene, polypropylene, polyethylene terephthalate, or polyester film, a paper, a cloth, a porous material such as nonwoven fabric, and appropriate thin materials such as a net, a foamed sheet, a metal foil, and any laminate thereof. A plastic film is preferably used because of its good surface smoothness.

Such a plastic film may be of any type capable of protecting the pressure-sensitive adhesive layer. Such a plastic film may be, for example, a polyethylene film, a polypropylene film, a polybutene film, a polybutadiene film, a polymethylpentene film, a polyvinyl chloride film, a vinyl chloride copolymer film, a polyethylene terephthalate film, a polybutylene terephthalate film, a polyurethane film, or an ethylene-vinyl acetate copolymer film.

The separator generally has a thickness of about 5 to about 200 µm, preferably about 5 to about 100 µm. If necessary, the separator may be subjected to a release treatment and an anti-pollution treatment with a silicone-based, fluoride-based, long-chain alkyl-based, or fatty acid amide-based release agent, a silica powder, or other materials, or subjected to an antistatic treatment of coating type, kneading and mixing type, vapor-deposition type, or other types. In particular, when the surface of the separator is appropriately subjected to a release treatment such as a silicone treatment, a long-chain alkyl treatment, or a fluorine treatment, the releasability from the pressure-sensitive adhesive layer can be further improved.

<Surface Protective Film>

A surface protective film may be provided on the polarizing film. The surface protective film generally has a base film and a pressure-sensitive adhesive layer. The surface protective film protects the polarizer with the pressure-sensitive adhesive layer interposed between them.

In view of the ability to be tested or managed, an isotropic or nearly-isotropic film material should be selected as the base film for the surface protective film. Examples of such a film material include polyester-based resins such as polyethylene terephthalate films, cellulose-based resins, acetate-based resins, polyethersulfone-based resins, polycarbonate-based resins, polyamide-based resins, polyimide-based resins, polyolefin-based resins, acryl-based resins, and other transparent polymers. In particular, polyester-based resins are preferred. The base film may be made of a single film material or a laminate of two or more film materials. The base film may also be a product obtained by stretching the film. The base film generally has a thickness of 500 µm or less, preferably 10 to 200 µm.

The pressure-sensitive adhesive used to form the pressure-sensitive adhesive layer for the surface protective film may be appropriately selected from pressure-sensitive adhesives including, as a base polymer, a (meth)acryl-based polymer, a silicone-based polymer, polyester, polyurethane, polyamide, polyether, fluoride-based polymer, rubber-based polymer, or any other polymer. An acrylic pressure-sensitive adhesive containing an acryl-based polymer as a base polymer is preferred in view of transparency, weather resistance, heat resistance, and other properties. The thickness (dry thickness) of the pressure-sensitive adhesive layer is selected depending on the desired adhesive strength. The thickness of the pressure-sensitive adhesive is generally from about 1 to about 100 μm, preferably from 5 to 50 μm.

A silicone, long-chain alkyl, or fluorine treatment with a low-adhesion material may also be performed to form a release treatment layer on the surface of the base film of the surface protective film, opposite to its surface on which the pressure-sensitive adhesive layer is provided.

EXAMPLES

Hereinafter, the invention will be more specifically described with reference to examples. It will be understood that the examples shown below are not intended to limit the invention. In each example, "parts" and "%" are all by weight. Unless otherwise specified below, the conditions of standing at room temperature include 23° C. and 65% RH in all cases.

<Preparation of Optical Film Laminate A>

A corona treatment was performed on one surface of an amorphous isophthalic acid-copolymerized polyethylene terephthalate (IPA-copolymerized PET) film substrate (100 μm in thickness) with a water absorption of 0.75% and a Tg of 75° C. An aqueous solution containing polyvinyl alcohol (4,200 in polymerization degree, 99.2% by mole in saponification degree) and acetoacetyl-modified PVA (Gohsefimer Z200 (trade name) manufactured by The Nippon Synthetic Chemical Industry Co., Ltd., 1,200 in polymerization degree, 4.6% in acetoacetyl modification degree, 99.0% by mole or more in saponification degree) in a ratio of 9:1 was applied to the corona-treated surface at 25° C. and then dried to form a 11-μm-thick PVA-based resin layer, so that a laminate was formed.

In an oven at 120° C., the resulting laminate was subjected to free-end uniaxial stretching to 2.0 times in the longitudinal direction between rolls at different peripheral speeds (auxiliary in-air stretching).

Subsequently, the laminate was immersed in an insolubilization bath (an aqueous boric acid solution obtained by adding 4 parts by weight of boric acid to 100 parts by weight of water) at a temperature of 30° C. for 30 seconds (insolubilization).

Subsequently, the laminate was immersed in a dyeing bath at a temperature of 30° C. while the iodine concentration and the immersion time were so controlled as to allow the resulting polarizing plate to have a predetermined transmittance. In this example, the laminate was immersed for 60 seconds in an aqueous iodine solution obtained by adding 0.2 parts by weight of iodine and 1.0 part by weight of potassium iodide to 100 parts by weight of water (dyeing).

Subsequently, the laminate was immersed for 30 seconds in a crosslinking bath (an aqueous boric acid solution obtained by adding 3 parts by weight of potassium iodide and 3 parts by weight of boric acid to 100 parts by weight of water) at a temperature of 30° C. (crosslinking).

The laminate was then uniaxially stretched to a total stretch ratio of 5.5 times in the longitudinal direction between rolls at different peripheral speeds while it was immersed in an aqueous boric acid solution (an aqueous solution obtained by adding 4 parts by weight of boric acid and 5 parts by weight of potassium iodide to 100 parts by weight of water) at a temperature of 70° C. (in-water stretching).

The laminate was then immersed in a cleaning bath (an aqueous solution obtained by adding 4 parts by weight of potassium iodide to 100 parts by weight of water) at a temperature of 30° C. (cleaning).

The resulting product was an optical film laminate A including a 5-μm-thick polarizer. The optical properties of resulting optical film laminate A were as follows: transmittance 42.8%, polarization degree 99.99%.

<Single-Body Transmittance T and Polarization Degree P of Polarizer>

The single-body transmittance T and polarization degree P of the resulting optical film laminate A including the polarizer were measured using an integrating sphere-equipped spectral transmittance meter (DOT-3C manufactured by Murakami Color Research Laboratory Co., Ltd.).

The polarization degree P is calculated from the formula below using the transmittance (parallel transmittance Tp) of a laminate of the same two one-side-protected polarizing films with their transmission axes parallel to each other and the transmittance (crossed transmittance Tc) of a laminate of the same two polarizing films with their transmission axes orthogonal to each other. Polarization degree P (%)={(Tp−Tc)/(Tp+Tc)}$^{1/2}$×100

Each transmittance was expressed as the Y value, which was obtained through luminosity correction using the two-degree field (illuminant C) according to JIS Z 8701 when the transmittance for completely polarized light obtained through a Glan-Taylor prism polarizer was normalized to 100%.

<Preparation of Optical Film Laminate B>

An optical film laminate B was obtained in the same manner as the method for preparing the optical film laminate A except that in the preparation of the optical film laminate A, a PVA-based resin layer having a thickness of 15 m was formed. The thickness of the obtained polarizer was 7 μm.

<Polyvinyl Alcohol (PVA)-Based Material>

A polyvinyl alcohol resin having a polymerization degree of 2500 and a saponification degree of 99.0 mol % was dissolved in pure water to prepare an aqueous solution having a solid content concentration of 4% by weight.

Production Example 1

<Acrylic Emulsion-Forming Material A>
(Preparation of Monomer Emulsion)

The monomer components shown in Table 1 were added to a container and mixed therein. Next, 12 parts of Aqualon HS-10 (manufactured by Dai-ichi Kogyo Seiyaku Co., Ltd.) as a reactive surfactant and 127 parts of ion-exchanged water were added to 200 parts of the prepared monomer component, and the mixture was forcedly emulsified while stirring for 5 minutes at 6000 (rpm) with use of a homomixer (manufactured by Tokushu Kika Kogyo Co., Ltd.) to prepare a monomer emulsion (A-1).

In a separate container, 12 parts of a reactive surfactant, Aqualon HS-10 (manufactured by Dai-ichi Kogyo Seiyaku Co., Ltd.) and 382 parts of ion-exchanged water were added to 600 parts of the monomer component prepared at the above ratio, and the mixture was forcedly emulsified while stirring for 5 minutes at 6000 (rpm) with use of a homomixer (manufactured by Tokushu Kika Kogyo Co., Ltd.) to prepare a monomer emulsion (A-2).

(Preparation of Forming Material A)

A reaction vessel equipped with a condenser tube, a nitrogen inlet tube, a thermometer, a dropping funnel and a stirring blade was charged with 339 parts of the monomer emulsion (A-1) prepared above and 442 parts of ion-exchanged water, and then the reaction vessel was thoroughly purged with nitrogen. After addition of 0.6 parts of ammonium persulfate, the mixture was polymerized at 60° C. for 1 hour with stirring. Then, 994 parts of the monomer emulsion (A-2) were added dropwise thereto over 3 hours while maintaining the reaction vessel at 60° C., and then polymerized for 3 hours to obtain a polymer emulsion having a solid content concentration of 46.0%. Next, after cooling the polymer emulsion to room temperature, an aqueous ammonia solution having a concentration of 10% was added to neutralize the pH to 8. To 100 parts of the neutralized polymer emulsion, 4.6 parts of diethylene glycol monobutyl ether acetate as a film forming aid was added and mixed to obtain a forming material B for an acrylic emulsion having a solid content of 44.0%.

which an ultraviolet curable type resin monomer or oligomer mainly composed of urethane acrylate was dissolved in butyl acetate, based on 100 parts of the solid content in the resin solution. To the blended solution, cyclopentanone (hereinafter referred to as "CPN") and propylene glycol monomethyl ether (hereinafter referred to as "PGM") were added in a ratio of 45:55 so that the solid content concentration in the solution was 36%. In this way, a hard coat layer-forming material to form a hard coat layer was prepared. A coating film was formed so that the hard coat after curing had a thickness of 7.5 upm. Subsequently, the coating

TABLE 1

| Forming material for transparent resin layer | Composition of monomer component (parts) | | | Number average molecular weight (Mn) | Weight average molecular weight (Mw) |
|---|---|---|---|---|---|
| | Methacrylic acid MAA | Alkyl acrylate EA BA | Alkyl methacrylate MM | | |
| Production Example 1 Acryl Em A | — | 10  53 | 36 | 2.0E+04 | 2.4E+05 |

The abbreviations in Table 1 are as follows.
MAA: Methacrylic acid
BA: Butyl acrylate
EA: Ethyl acrylate
MM: Methyl methacrylate <Hard Coat-Forming Material 1 and Formation Thereof>

As a resin contained in the coating liquid, 70 parts by weight of an ultraviolet curable urethane acrylate resin (trade name "UV 1700B", manufactured by Nippon Synthetic Chemical Industry Co., Ltd., solid content 100%) and 30 parts by weight of a polyfunctional acrylate (trade name "VISCOAT #300", manufactured by Osaka Organic Chemical Industry Ltd., solid content 100%) mainly composed of pentaerythritol triacrylate were prepared. Two parts by weight of acryl-styrene copolymer particles (manufactured by Sekisui Plastics Co., Ltd., trade name "TECHPOLYMER", weight average particle diameter: 3.0 μm, refractive index: 1.52) as the particles, 0.4 parts by weight of a synthetic smectite which is an organoclay (manufactured by Co-op Chemical Co., Ltd., trade name "LUCENTITE SAN") as the thixotropy-imparting agent, 3 parts by weight of a photopolymerization initiator (trade name "IRGACURE 907" manufactured by BASF), and 0.5 parts by weight of a leveling agent (trade name "PC4100", manufactured by DIC Corporation, solid content 10%) were mixed, based on 100 parts by weight of the resin solid content of the resin. The organoclay was diluted with toluene so as to have a solid content of 6% for use. This mixture was diluted with a mixed solvent of toluene/cyclopentanone (CPN) (weight ratio 80/20) so that the solid content concentration became 50% by weight and treated with an ultrasonic disperser to prepare a coating liquid. A coating film was formed so that the hard coat after curing had a thickness of 7.0 μm. Then, the coating film was dried at 90° C. for 2 minutes and then subjected to curing treatment by irradiation of ultraviolet rays at a cumulative light amount of 300 mJ/c² using a high-pressure mercury lamp.

<Hard Coat-Forming Material 2 and Formation Thereof>

Five parts of a photopolymerization initiator (trade name "IRGACURE 907", manufactured by Ciba Japan K.K.) and 0.01 parts of a leveling agent (trade name "GRANDIC PC 4100" manufactured by DIC Corporation) were added to a resin solution (trade name "UNIDIC 17-806", solid content concentration: 80%, manufactured by DIC Corporation) in film was dried at 90° C. for 1 minute and then subjected to curing treatment by irradiation of ultraviolet rays at a cumulative light amount of 300 mJ/cm² using a high-pressure mercury lamp.

<Low Reflection Treatment Layer-Forming Material 3 and Formation Thereof>

Based on 100 parts of the solid content in a polyfunctional acrylate (trade name "VISCOAT #300", solid content 100%, manufactured by Osaka Organic Chemical Industry Ltd.) mainly composed of pentaerythritol triacrylate), 5 parts of a photopolymerization initiator (trade name "IRGACURE 907", manufactured by Ciba Japan K.K.) and a hollow silica sol (trade name "THRULYA 4320" manufactured by JGC C&C Ltd., solid content 20%) were used, mixed, and diluted in MIBK (methyl isobutyl ketone) so that the solid content concentration was 2.0% and the refractive index of the cured film was 1.40, thereby to prepare a coating liquid for forming an antireflection layer. A coating film was formed so as to have a thickness of 100 nm. Thereafter, the coating film was dried at 60° C. for 1 minute and then subjected to curing treatment by irradiation of ultraviolet rays at a cumulative light amount of 300 mJ/cm² using a high-pressure mercury lamp.

<Low Reflection Treatment Layer-Forming Material 4 and Formation Thereof>

Based on 100 parts of the solid content in a polyfunctional acrylate (trade name "VISCOAT #300", solid content 100%, manufactured by Osaka Organic Chemical Industry Ltd.) mainly composed of pentaerythritol triacrylate), 5 parts of a photopolymerization initiator (trade name "IRGACURE 907", manufactured by Ciba Japan K.K.) and a hollow silica sol (trade name "THRULYA 4320" manufactured by JGC C&C Ltd., solid content 20%) were used, mixed, and diluted in MIBK (methyl isobutyl ketone) so that the solid content concentration was 2.0% and the refractive index of the cured film was 1.35, thereby to prepare a coating liquid for forming an antireflection layer. A coating film was formed so as to have a thickness of 100 nm. Thereafter, the coating film was dried at 60° C. for 1 minute and then subjected to curing treatment by irradiation of ultraviolet rays at a cumulative light amount of 300 mJ/cm² using a high-pressure mercury lamp.

<Low Reflection Treatment Layer-Forming Material 5 and Formation Thereof>

Based on 100 parts of the solid content in a polyfunctional acrylate (trade name "VISCOAT #300", solid content 100%, manufactured by Osaka Organic Chemical Industry Ltd.) mainly composed of pentaerythritol triacrylate), 5 parts of a photopolymerization initiator (trade name "IRGACURE 907", manufactured by Ciba Japan K.K.) and a hollow silica sol (trade name "THRULYA 4320" manufactured by JGC C&C Ltd., solid content 20%) were used, mixed, and diluted in MIBK (methyl isobutyl ketone) so that the solid content concentration was 2.0% and the refractive index of the cured film was 1.30, thereby to prepare a coating liquid for forming an antireflection layer. A coating film was formed so as to have a thickness of 100 nm. Thereafter, the coating film was dried at 60° C. for 1 minute and then subjected to curing treatment by irradiation of ultraviolet rays at a cumulative light amount of 300 mJ/cm² using a high-pressure mercury lamp.

<Low Reflection Treatment Layer-Forming Material 6 and Formation Thereof>

Based on 100 parts of the solid content in a polyfunctional acrylate (trade name "VISCOAT #300", solid content 100%, manufactured by Osaka Organic Chemical Industry Ltd.) mainly composed of pentaerythritol triacrylate), 5 parts of a photopolymerization initiator (trade name "IRGACURE 907", manufactured by Ciba Japan K.K.) and zirconium oxide-containing acrylate (trade name "KZ6661" manufactured by JSR Corporation, solid content 50%) were used, mixed, and diluted in MIBK (methyl isobutyl ketone) so that the solid content concentration was 2.0% and the refractive index of the cured film was 1.62, thereby to prepare a coating liquid for forming an antireflection layer. A coating film was formed so as to have a thickness of 80 nm. Thereafter, the coating film was dried at 60° C. for 1 minute and then subjected to curing treatment by irradiation of ultraviolet rays at a cumulative light amount of 300 mJ/cm² using a high-pressure mercury lamp.

<Refractive Index Measurement>

The refractive index was determined according to JIS K 0062-1992.

Example 1

(Formation of Transparent Resin Layer)

On the surface of the polarizer of the optical film laminate A, the polyvinyl alcohol type forming material A adjusted to 25° C. was applied using a wire bar coater so that the thickness (not including a compatible layer) after drying became 1.0 μm. Thereafter, the coated forming material A was dried with hot air at 80° C. for 30 seconds to form a transparent resin layer, thereby to prepare a polarizing film.

(Formation of Low Reflection Treatment Layer)

The hard coat layer-forming material 1 was applied onto a transparent plastic film substrate (triacetyl cellulose film, manufactured by Fujifilm Holdings Corporation, trade name "FUJITAC", thickness: 40 μm, refractive index: 1.49) to form a hard coating film. Subsequently, a low reflection treatment layer-forming material 3 was coated on the hard coat layer to form a low reflection layer, thereby to obtain a substrate film having a low reflection treatment layer.

(Reflectance)

On the surface of the substrate film on which the low reflection treatment layer was not formed, a black acrylic plate (thickness: 2.0 mm) manufactured by Mitsubishi Rayon Co., Ltd. was bonded with a pressure-sensitive adhesive having a thickness of about 20 μm to eliminate reflection on the back surface, and then the reflectance on the surface (low reflection treatment layer) was measured. For the reflectance, spectral reflectance was measured by integrating sphere measurement using a spectrophotometer (trade name: U-4100) manufactured by JASCO Corporation. Total reflectance Y value, hue a value and hue b value of C light source/2°-vision were determined.

Subsequently, a substrate film having a low reflection treatment layer was laminated with a pressure-sensitive adhesive layer having a thickness of 12 μm on the transparent resin layer side of the polarizing film obtained above, thereby to prepare a low-reflection-treatment-layer-attached polarizing film.

Examples 2 to 10, Comparative Examples 1 to 6, and Reference Example 1

Polarizing films were prepared in the same manner as in Example 1 except that the kind of the transparent resin layer-forming material and the thickness of the transparent resin layer were changed as shown in Table 2, and the low reflection treatment layer-forming material was changed as shown in Table 2 in Example 1.

As shown in Table 2, in Example 9 and Comparative Example 5, two low reflection treatment layers were formed. In Comparative Examples 1 to 5, a low reflection treatment layer was formed without forming a transparent resin layer. In Reference Example 1, the low reflection treatment layer-forming material was not used.

The polarizing films obtained in the above Examples and Comparative Examples were evaluated as follows. The results are shown in Table 2.

<Confirmation of Thickness of Compatible Layer>

Figure 4:
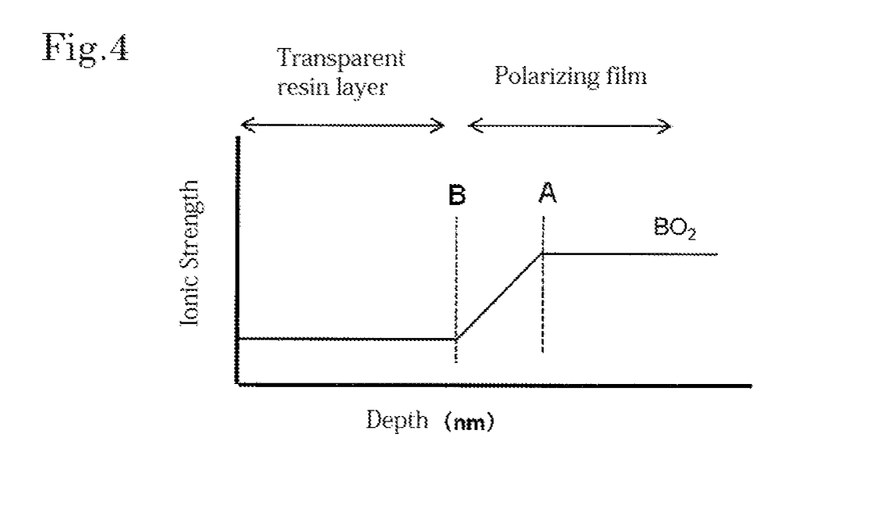
FIG. 4 is a graph relating to measurement of a compatible layer.

The thickness of the compatible layer was measured by TOF-SIMS equipped with a gas cluster ion gun. The film thickness of the transparent resin layer (not including the compatible layer) of the polarizing film (sample) was calculated in advance by precisely calculating the film thickness with a scanning electron microscope, and such calculated numerical values were used. The depth profile was observed while etching with an argon cluster from the transparent resin layer side of the polarizing film (sample) toward the polarizer side, and "$BO_2^-$ ion" (ionic strength) derived from the polarizer was extracted. A graph as shown in FIG. 4 was prepared for the depth (nm) from the transparent resin layer side and the "$BO_2^-$ ion" (ionic strength). When "B" is the thickness of the transparent resin layer measured by the electron microscope and "A" is the point where the "$BO_2^-$ ion" starts decreasing from the side of the polarizer toward the side of the transparent resin layer, "the distance between A and B" was regarded as the thickness of the compatible layer. The film thickness of each of the polarizer and the transparent resin layer in Example 1 was measured with a scanning electron microscope. As a result, the thickness of the transparent resin layer was 1.0 μm while the thickness of the polarizer was 5.0 μm. In addition, as a result of measuring the ionic strength while etching from the transparent resin layer side by TOF-SIMS, a graph as shown in FIG. 4 was obtained. The "$BO_2^-$ ion" strength in the transparent resin layer of FIG. 4 was 0.8 while the "$BO_2^-$ ion" strength in the polarizer was 3.5. As shown in FIG. 4, a gradient of the "$BO_2^-$ ion" strength was formed between A and B. When the "distance between A and B" is converted from the etching rate of the argon cluster, the thickness of the compatible layer was 0.1 μm. Further, when the boric acid content was measured using the FTIR described in the Example in the portion of "$BO_2^-$ ion" strength of 0.8 on the transparent resin layer side, the boric acid content was found to be 4%. On the other hand, the boric acid content in the polarizer in which the "$BO_2^-$ ion" strength in TOF-SIMS was 3.5 was determined by FTIR before forming the transparent resin layer, revealing that the boric acid content was 16%. From this, it can be seen that boric acid exists with a gradient in the compatible layer in the polarizer (the compatible layer corresponds to the boric acid low concentration layer having a relatively lower boric acid concentration than the other portions of the polarizer.).

<Optical Properties: Hue Change Amount Δab>

The hue change amount Δab was obtained by the following formula. $\Delta ab=\sqrt{(\text{polarizing film a value}-\text{substrate film a value})^2+(\text{polarizing film b value}-\text{substrate film b value})^2}$. The Δab is preferably 1.0 or less, more preferably 0.5 or less.

○: The Δab is 0.5 or less.
Δ: The Δab is 1.0 or less.
x: The Δab is greater than 1.0.

DESCRIPTION OF REFERENCE SIGNS

1: Polarizer
2a, 2b: Transparent resin layer
3: Low reflection treatment layer
4: Substrate film
5: Pressure-sensitive adhesive layer
6: Interlayer filler
7: Transparent substrate
10: Polarizing film
11: Polarizing film
12: Configuration including polarizing film
X: Compatible layer
A: Thickness of polarizer
B: Thickness of compatible layer

The invention claimed is:

1. A polarizing film, provided on the viewing side in an image display device, wherein the polarizing film has a polarizer and a first transparent resin layer on the viewing side of the polarizer, and the polarizer contains a polyvinyl alcohol-based resin, has a thickness of 10 μm or less, and has, on the side of the first transparent resin layer, a compatible layer which is compatible with the first transparent resin layer and which corresponds to a thickness of 2 to 10% of the thickness of the polarizer.

TABLE 2

| | Polarizer | | Transparent resin layer | | Compatible layer | | Low reflection treatment layer | | | | Optical properties |
|---|---|---|---|---|---|---|---|---|---|---|---|
| | | | | | | (B/A) × 100: | | | | | Hue change |
| | Kind | Thickness (A) | Kind of forming material | Thickness | Thickness (B) | ratio to polarizer | Hard coat layer | First layer | Second layer | Reflectance Y (%) | amount Δab |
| Example 1 | A | 5 μm | PVA | 1.0 μm | 0.1 μm | 2.0% | Forming material 1 | Forming material 3 | — | 1.5 | 0.67 |
| Example 2 | A | 5 μm | PVA | 1.0 μm | 0.3 μm | 6.0% | Forming material 1 | Forming material 3 | — | 1.5 | 0.23 |
| Example 3 | A | 5 μm | ACRYL Em A | 1.0 μm | 0.3 μm | 6.0% | Forming material 1 | Forming material 3 | — | 1.5 | 0.34 |
| Example 4 | A | 5 μm | PVA | 0.3 μm | 0.1 μm | 2.0% | Forming material 1 | Forming material 3 | — | 1.5 | 0.54 |
| Example 5 | A | 5 μm | PVA | 3.0 μm | 0.5 μm | 10.0% | Forming material 1 | Forming material 3 | — | 1.5 | 0.05 |
| Example 6 | A | 5 μm | PVA | 1.0 μm | 0.3 μm | 4.3% | Forming material 1 | Forming material 3 | — | 1.5 | 0.39 |
| Example 7 | A | 5 μm | PVA | 1.0 μm | 0.3 μm | 6.0% | Forming material 2 | Forming material 3 | — | 1.2 | 0.27 |
| Example 8 | A | 5 μm | PVA | 1.0 μm | 0.3 μm | 6.0% | Forming material 2 | Forming material 4 | — | 0.8 | 0.27 |
| Example 9 | A | 5 μm | PVA | 1.0 μm | 0.3 μm | 6.0% | Forming material 2 | Forming material 6 | Forming material 3 | 0.3 | 0.28 |
| Example | A | 5 μm | PVA | 1.0 μm | 0.3 μm | 6.0% | Forming material 2 | Forming material 5 | — | 0.4 | 0.28 |
| Comparative Example 1 | A | 5 μm | — | — | — | — | Forming material 1 | Forming material 3 | — | 1.5 | 1.30 |
| Comparative Example 2 | A | 5 μm | — | — | — | — | Forming material 2 | Forming material 3 | — | 1.2 | 1.04 |
| Comparative Example 3 | A | 5 μm | — | — | — | — | Forming material 2 | Forming material 4 | — | 0.8 | 1.14 |
| Comparative Example 4 | A | 5 μm | — | — | — | — | Forming material 2 | Forming material 6 | Forming material 3 | 0.4 | 1.43 |
| Comparative Example 5 | A | 5 μm | — | — | — | — | Forming material 2 | Forming material 5 | — | 0.5 | 1.41 |
| Reference Example | A | 5 μm | — | — | — | — | Forming material 1 | — | — | 4.0 | 0.23 |

2. The polarizing film according to claim 1, wherein the first transparent resin layer is a formed product of a forming material containing a polyvinyl alcohol-based resin or a forming material containing an aqueous emulsion.

3. The polarizing film according to claim 2, wherein a second transparent resin layer is provided on the side opposite to the viewing side of the polarizer.

4. The polarizing film according to claim 1, wherein the first transparent resin layer has a thickness of 0.2 μm or more and 3 μm or less.

5. The polarizing film according to claim 4, wherein a second transparent resin layer is provided on the side opposite to the viewing side of the polarizer.

6. The polarizing film according to claim 1, wherein the polarizer is designed so that optical properties represented by a single-body transmittance T and a polarization degree P satisfy the condition of the following formula:

$$P > -(10^{0.929T-42.4}-1) \times 100 \text{ (provided that } T<42.3) \text{ or}$$
$$P \geq 99.9 \text{ (provided that } T \geq 42.3).$$

7. The polarizing film according to claim 6, wherein a second transparent resin layer is provided on the side opposite to the viewing side of the polarizer.

8. The polarizing film according to claim 1, wherein a second transparent resin layer is provided on the side opposite to the viewing side of the polarizer.

9. The polarizing film according to claim 1, further having a low reflection treatment layer on the viewing side of the first transparent resin layer.

10. The polarizing film according to claim 9, wherein the low reflection treatment layer has a reflectance of 2% or less.

11. An image display device having at least a polarizing film, wherein a polarizing film provided on the viewing side in the image display device is the polarizing film according to claim 1, and the first transparent resin layer of the polarizing film is disposed so as to be on the viewing side.

12. An image display device comprising the polarizing film according claim 1 and a low reflection treatment layer disposed on the viewing side from the polarizing film.

13. The image display device according to claim 12, wherein the low reflection treatment layer has a reflectance of 2% or less.

* * * * *